US006188934B1

United States Patent
Emura

(10) Patent No.: US 6,188,934 B1
(45) Date of Patent: Feb. 13, 2001

(54) REGISTER CORRESPONDENCE METHOD USING I/O TERMINALS, DETERMINED REGISTERS, THE NUMBER OF UNDETERMINED REGISTERS AND SELF-FEEDBACK INFORMATION TO DEFINE UNIQUE REGISTERS

(75) Inventor: Hideyuki Emura, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/090,974

(22) Filed: Jun. 5, 1998

(30) Foreign Application Priority Data

Jun. 6, 1997 (JP) .................................................. 9-149224

(51) Int. Cl.[7] .................................................. G06F 19/00
(52) U.S. Cl. ............................. 700/110; 700/97; 700/98; 700/108; 700/109; 700/121; 716/3; 716/4; 716/5; 716/6
(58) Field of Search .................................. 716/3, 4, 5, 6; 700/97, 98, 105–109, 110, 121

(56) References Cited

U.S. PATENT DOCUMENTS

| 5,497,499 | * | 3/1996 | Grag et al. ................................ 716/4 |
| 5,671,395 | * | 9/1997 | Akiyama ................................ 700/98 |
| 5,831,996 | * | 11/1998 | Abramovici et al. ................ 716/4 |
| 5,903,467 | * | 5/1999 | Puri et al. .............................. 716/5 |
| 5,907,698 | * | 5/1999 | Kucukcakar et al. ................ 716/6 |
| 5,933,349 | * | 8/1999 | Dalgleish et al. ................... 700/97 |
| 5,949,691 | * | 9/1999 | Kurosaka et al. ..................... 716/5 |
| 5,966,521 | * | 10/1999 | Takeuchi et al. ..................... 716/6 |
| 6,000,038 | * | 12/1999 | Scepanovic et al. .................. 716/6 |
| 6,006,023 | * | 12/1999 | Higashida ............................ 716/6 |
| 6,026,219 | * | 2/2000 | Miller et al. ........................ 716/6 |
| 6,032,082 | * | 2/2000 | Anazawa ............................ 700/97 |

FOREIGN PATENT DOCUMENTS

| 6-20000 | 1/1994 | (JP) . |
| 8-22485 | 1/1996 | (JP) . |

* cited by examiner

Primary Examiner—Paul P. Gordon
Assistant Examiner—Ramesh Patel
(74) Attorney, Agent, or Firm—Foley & Lardner

(57) ABSTRACT

In a register correspondence method in a logic equivalence verifying system for first and second sequential circuit information, input cone information is collected for each register of the first and second sequential circuit information. The input cone information is represented by external input terminals, determined registers, a number of undetermined registers and self-feedback information showing presence or absence of a self-feedback loop. Then, a first register having unique input cone information is selected from the first sequential circuit information, and a second register having unique input cone information is selected from the second sequential circuit information. Then, the input cone information of the first register is compared with that of the second register, thus establishing a register correspondence between the first and second registers.

12 Claims, 25 Drawing Sheets

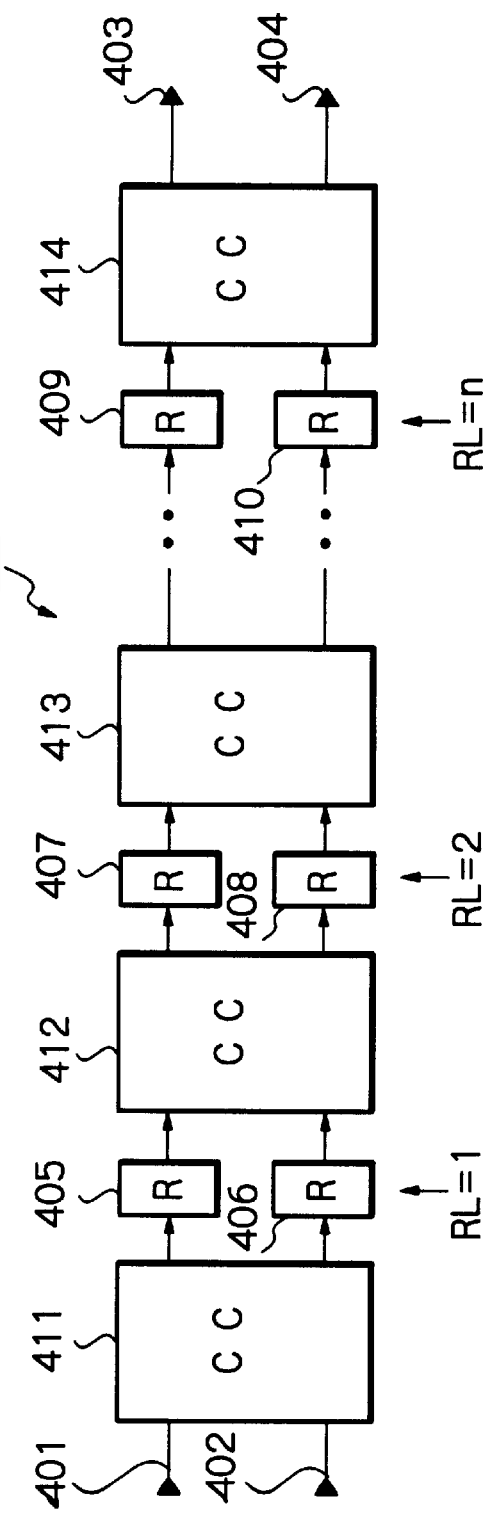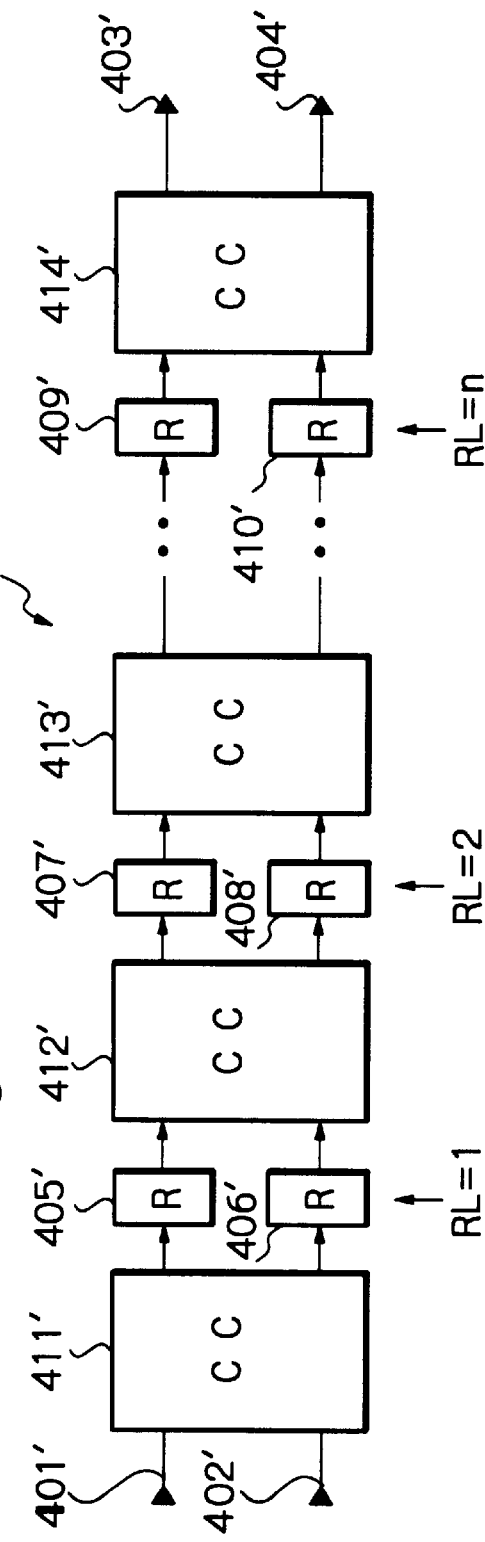
Fig. 4A PRIOR ART
Fig. 4B PRIOR ART

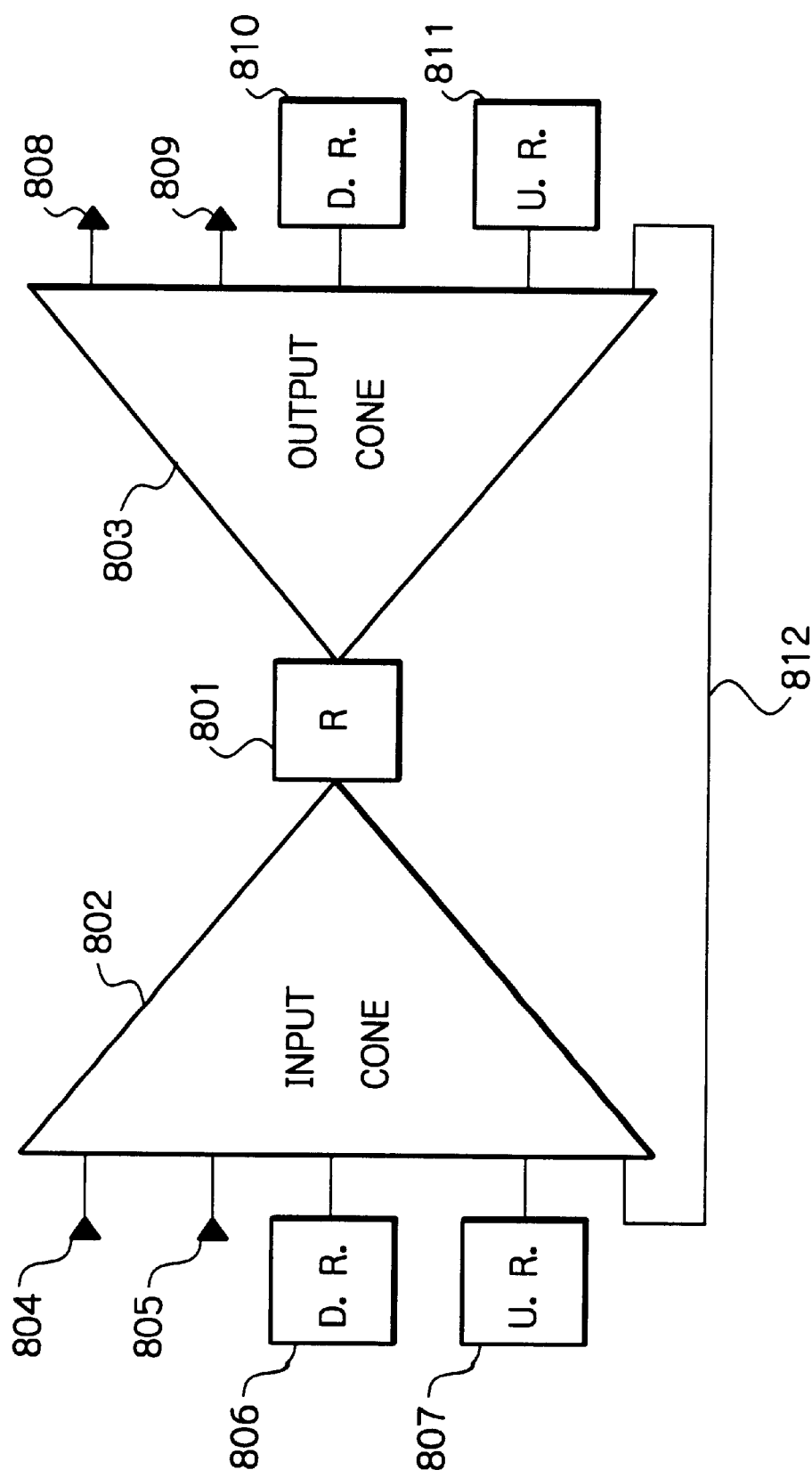

Fig. 9

| GROUP | | NUMBER OF REG. | | |
|---|---|---|---|---|
| | | $C_1$ | $C_2$ | |
| I | "a" | 1 | 0 | × |
| | "b" | 0 | 1 | × |
| | "c" | 1 | 1 | ○ |
| II | "d" | ≧2 | - | × |
| | "e" | - | ≧2 | × |

— don't care

/ CONSTANT SIGNAL
× CUT FLAG

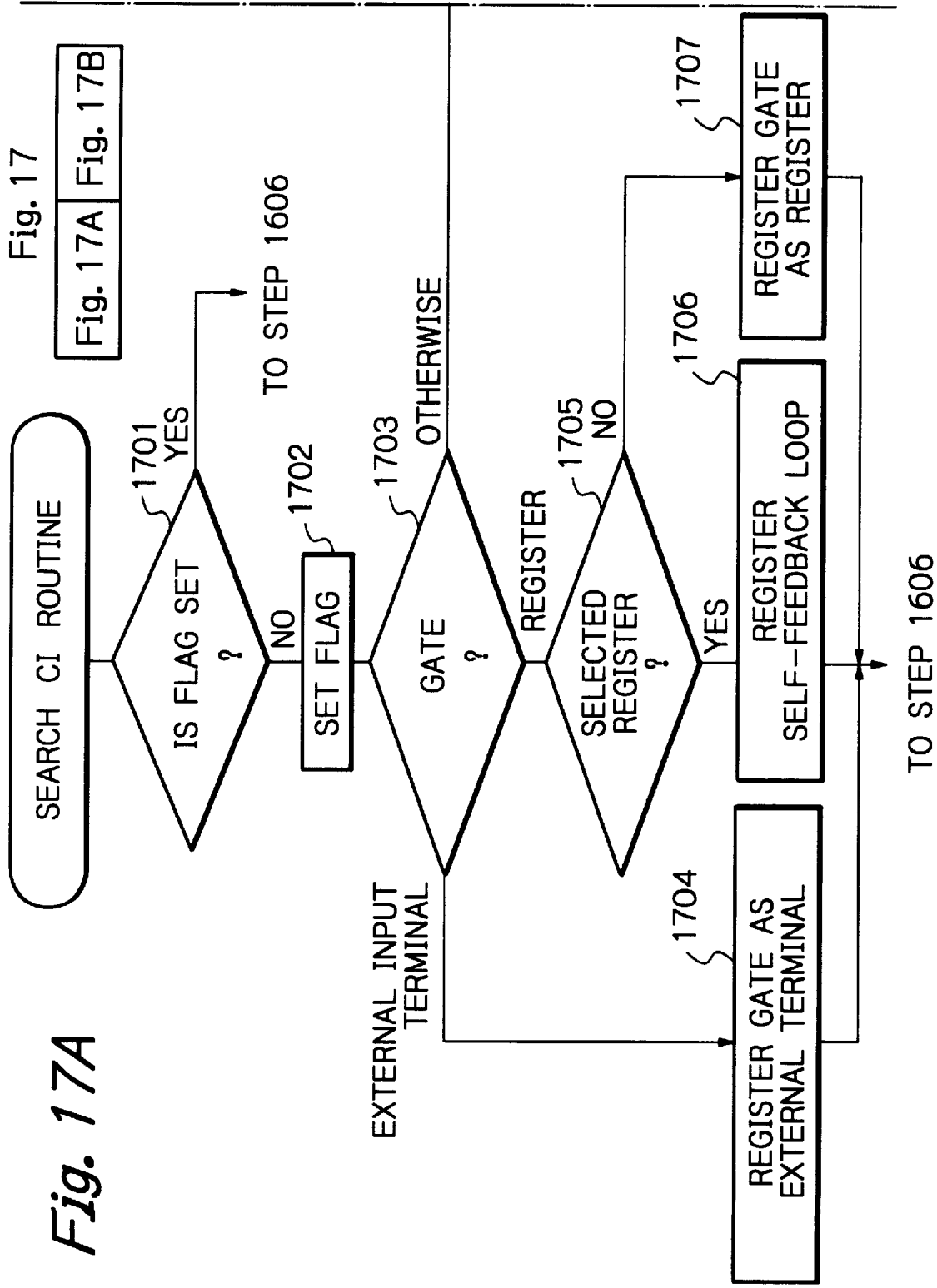

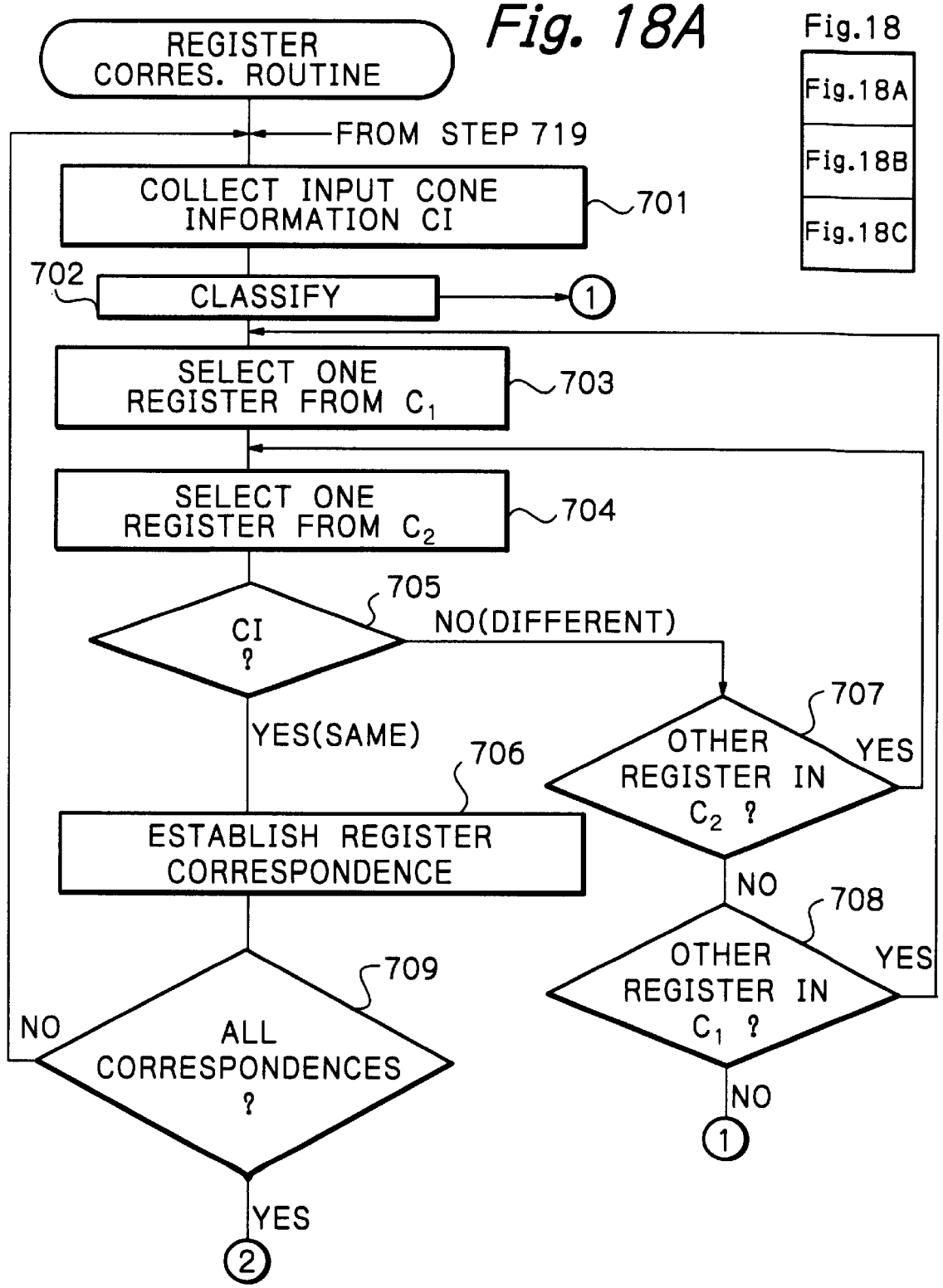

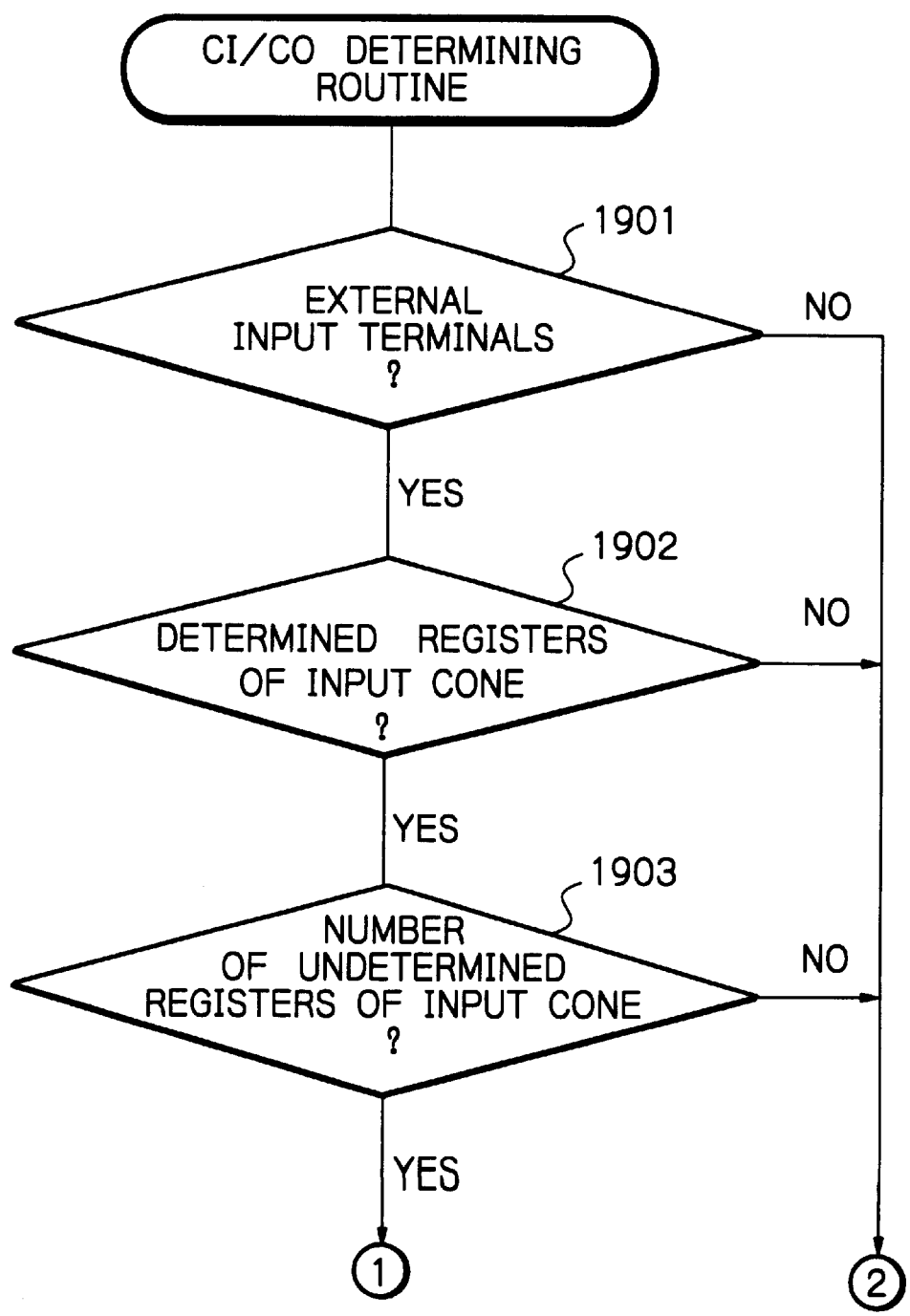

REGISTER CORRESPONDENCE METHOD USING I/O TERMINALS, DETERMINED REGISTERS, THE NUMBER OF UNDETERMINED REGISTERS AND SELF-FEEDBACK INFORMATION TO DEFINE UNIQUE REGISTERS

BACKGROUND OF THE INVENTION

1. Field of the Invention

The present invention relates to a register correspondence method in a logic equivalence verifying system.

2. Description of the Related Art

As verifying functions of circuits, use is generally made of simulation methods. Particularly, if the function of a circuit is written in hardware description language (HDL), a designer recognizes the function of circuit by a simulation method. Then, the designer designs a new circuit by modifying the HDL written circuit using a logic synthesis system or manually. In this case, the designer again verifies the function of the new circuit by a simulation method with reference to the result of the above-mentioned simulation method.

In the above-mentioned verifying method using simulation methods, however, if the circuit becomes remarkably large, it takes a long time to verify the circuit since a large number of test patterns are required.

In order to reduce the verifying time, a prior art logic equivalence verifying system for directly comparing circuit information with reference circuit information has been developed (see JP-A-8-22485).

In this logic equivalence verifying system, a circuit analysis section analyzes two kinds of circuit information to recognize external terminals, registers and combination circuits from each of the circuit information. Next, a register correspondence section makes a register correspondence between two kinds of the circuit information automatically or manually. Next, a logic extraction section extracts logic information of the combination circuits of the two kinds of circuit information as a binary decision diagram (BDD) for every verification point. This will be explained later in detail.

However, if the register correspondence section of the prior logic equivalence verifying system is forcibly applied to a sequential circuit having a feedback loop, the register correspondence processing time is increased.

Further, in the prior art register correspondence, if test circuits are added in circuit information, it is impossible to make a register correspondence.

SUMMARY OF THE INVENTION

It is an object of the present invention to provide a register correspondence method in a logic equivalence verifying system which can be carried out even when circuit information includes a feedback loop and test circuits.

According to the present invention, in a register correspondence method in a logic equivalence verifying system for first and second sequential circuit information, input cone information is collected for each register of the first and second sequential circuit information. The input cone information is represented by external input terminals, determined registers, a number of undetermined registers and self-feedback information showing presence or absence of a self-feedback loop. Then, a first register having unique input cone information is selected from the first sequential circuit information, and a second register having unique input cone information is selected from the second sequential circuit information. Then, the input cone information of the first register is compared with the second register, thus establishing a register correspondence between the first and second registers.

Also, before the input cone information is collected, constant signals to circuit elements of the first and second sequential circuit information are propagated and connections to input terminals of the circuit elements are cut.

BRIEF DESCRIPTION OF THE DRAWINGS

The present invention will be more clearly understood from the description as set forth below, as compared with the prior art, with reference to the accompanying drawings, wherein:

FIGS. 4A and 4B are block circuit diagrams of sequential circuits for explaining the flowchart of FIG. 3;

FIG. 8 is a circuit diagram for explaining the input cone information and the output cone information of FIGS. 7A and 7B;

FIG. 9 is a table of the groups of registers for explaining the classifying steps of FIGS. 7A and 7B;

FIGS. 17A and 17B are detailed flowcharts of the subroutine of FIG. 16;

FIGS. 18A, 18B and 18C are flowcharts of modifications of the flowcharts of FIGS. 7A and 7B; and FIGS. 19A and 19B are detailed flowcharts of the input/output cone information comparing step of FIG. 18C.

DESCRIPTION OF THE PREFERRED EMBODIMENTS

Before the description of the preferred embodiments, a prior art logic equivalence verifying system will be explained with reference to FIGS. 1, 2A, 2B, 3, 4A, 4B, 5, 6A and 6B.

Figure 1:
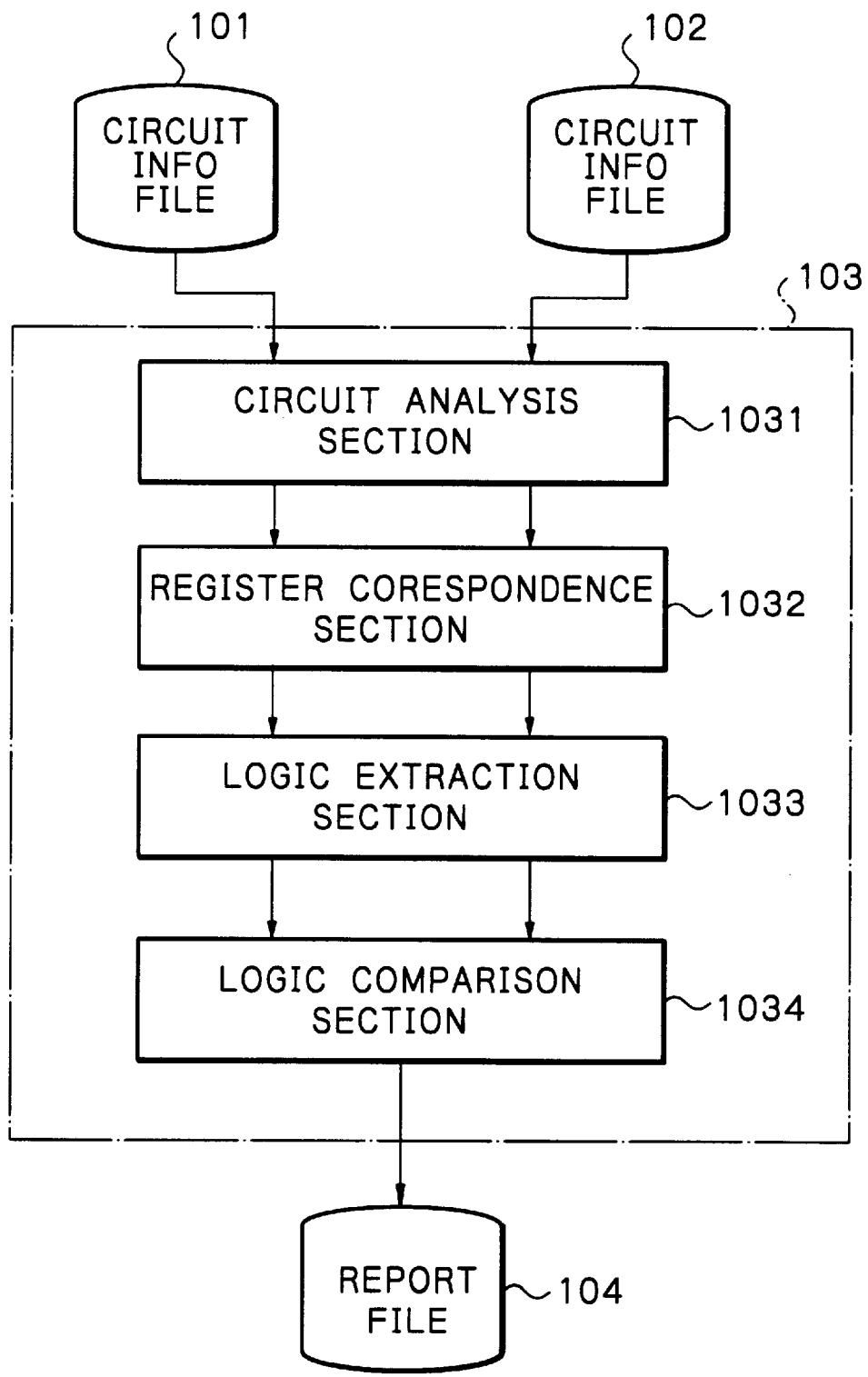
FIG. 1 is a block circuit diagram illustrating a prior art logic equivalence verifying apparatus.

In FIG. 1, which illustrates a prior art logic equivalence verifying system (see JA-A-8-22485), reference numerals 101 and 102 designate circuit information files for storing circuit information which can be written in any HDL description or other description for describing net lists. Circuit information $C_1$ and $C_2$ are supplied from the circuit information files 101 and 102 to a logic equivalence verifying system 103 which, in turn, generates a verification report and transmits it to a report file 104.

In the logic equivalence verifying system 103, a circuit analysis section 1031 analyzes the circuit information $C_1$ and $C_2$ to recognize external terminals, registers and combination circuits from each of the circuit information $C_1$ and $C_2$. For example, if the circuit information $C_1$ includes a sequential circuit as illustrated in FIG. 2A, the circuit analysis section 1031 recognizes external input terminals 201 and 202, external output terminals 203 and 204, registers 205 and 206, and combination circuits 207 and 208.

Figure 2A:
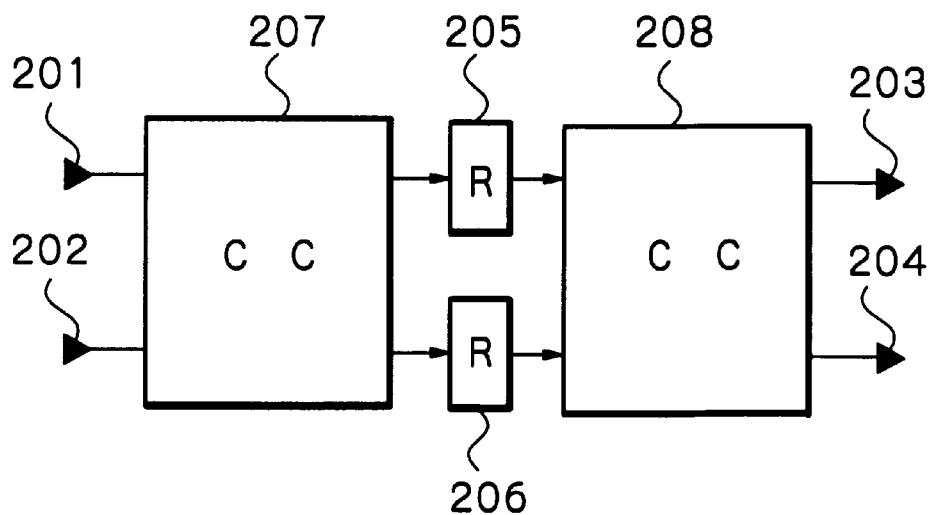
FIGS. 2A and 2B are block circuit diagrams of sequential circuits for explaining the operation of the apparatus of FIG. 1.

Next, a register correspondence section 1032 makes a correspondence between the registers 205 and 206 of the circuit information $C_1$ as illustrated in FIG. 2A and the registers (not shown) of the circuit information $C_2$ automatically or manually. This will be explained later in detail.

Figure 2B:
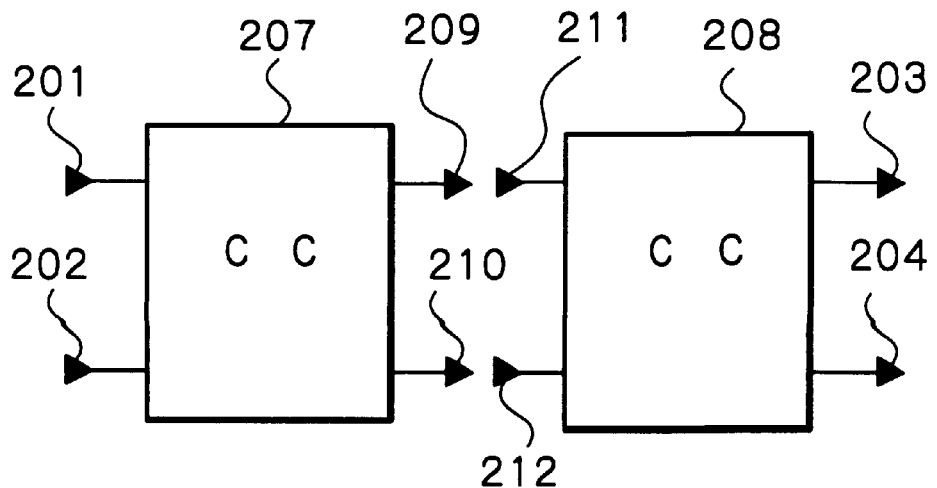

Next, a logic extraction section 1033 extracts logic information of the combination circuits 207 and 208 of the circuit information $C_1$ and logic information from the combination circuits (not shown) of the circuit information $C_2$ as BDD for every verification point. In this case, as illustrated in FIG. 2B, the registers 205 and 206 of FIG. 2A are replaced with external output terminals 209 and 210 of the combination circuit 207 and internal input terminals 211 and 212 of the combination circuit 208. Then, the logic extraction section transmits the extracted logic information from each of the circuit information $C_1$ and $C_2$ to a logic comparision section 1034.

The logic comparison section 1034 compares the extracted logic information of the combination circuits included in the circuit information $C_1$ with the counterpart extracted logic information of the combination circuits included in the circuit information $C_2$. Then the logic comparison section 1034 generates a verification report and stores it in the report file 104. The verification report also includes information regarding names of verification points where logic information is different, input patterns which cause logic information to be different from each other, and logic information showing the degree of noncoincidence between logic information.

The operation of the logic equivalence verifying system 103 of FIG. 1 is explained next with reference to FIGS. 3, 4A and 4B. Here, FIG. 4A is a block circuit diagram of a sequential circuit based upon the circuit information $C_1$ and FIG. 4B is a block circuit diagram of a sequential circuit based upon the circuit information $C_2$. Also, in FIGS. 4A and 4B, reference numerals 401 and 402 (401' and 402') designate external input terminals, 403 and 404 (403' and 404') designate external output terminals, 405 to 410 (405' to 410') designate registers, and 411 to 414 (411' to 414') designate combination circuits.

First, at step 301, the register correspondence section 1032 calculates a maximum register level "n" from the circuit information $C_1$ and $C_2$. Note that the maximum register level "n" shows a number of stages of registers as illustrated in FIGS. 4A and 4B.

Next, at step 302, a register level RL is caused to be 1.

Next, at step 303, one register of the register level RL of the circuit information $C_1$ which does not have a correspondence with one register of the register level RL of the circuit information $C_2$ is selected. Also, at step 304, one register of the register level RL of the circuit information $C_2$ which does not have a correspondence with one register of the register level RL of the circuit information $C_1$ is selected.

Next, at step 305, it is determined whether or not the inputs of an input cone (combination circuit) connected to the selected register of the circuit information $C_1$ are logically the same as those of an input cone (combination circuit) connected to the selected register of the circuit information $C_2$. As a result, if logically the same, the control proceeds to step 306 which establishes a correspondence between the two selected registers of the circuit information $C_1$ and $C_2$. If logically different from each other, the control proceeds to step 307 which repeats the operation at steps 304 and 305 for other non-selected registers of the register level RL of the circuit information $C_2$.

Step 308 repeats the operation at steps 303 through 307 for other non-selected registers of the register level RL of the circuit information $C_1$.

Steps 309 and 310 repeat the operation at steps 303 through 308 until the register level RL reaches "n".

For example, as illustrated in FIGS. 4A and 4B, the registers 405 and 406 of the register level RL=1 of the circuit information $C_1$ correspond to the registers 405' and 406', respectively, of the register level RL=1 of the circuit information $C_2$.

Figure 3:
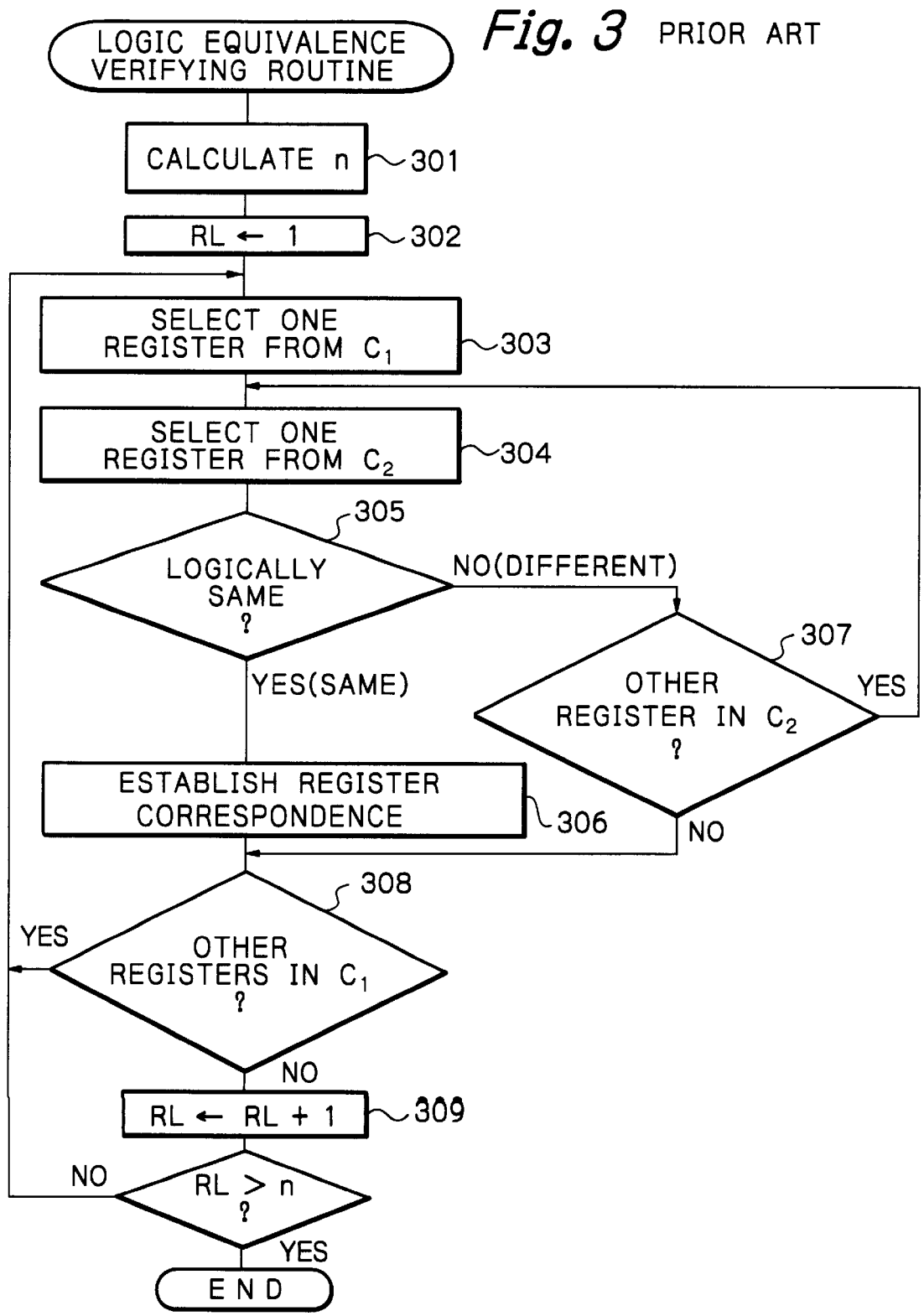
FIG. 3 is a flowchart showing the operation of the logic equivalence verifying system of FIG. 1.
Figure 5:
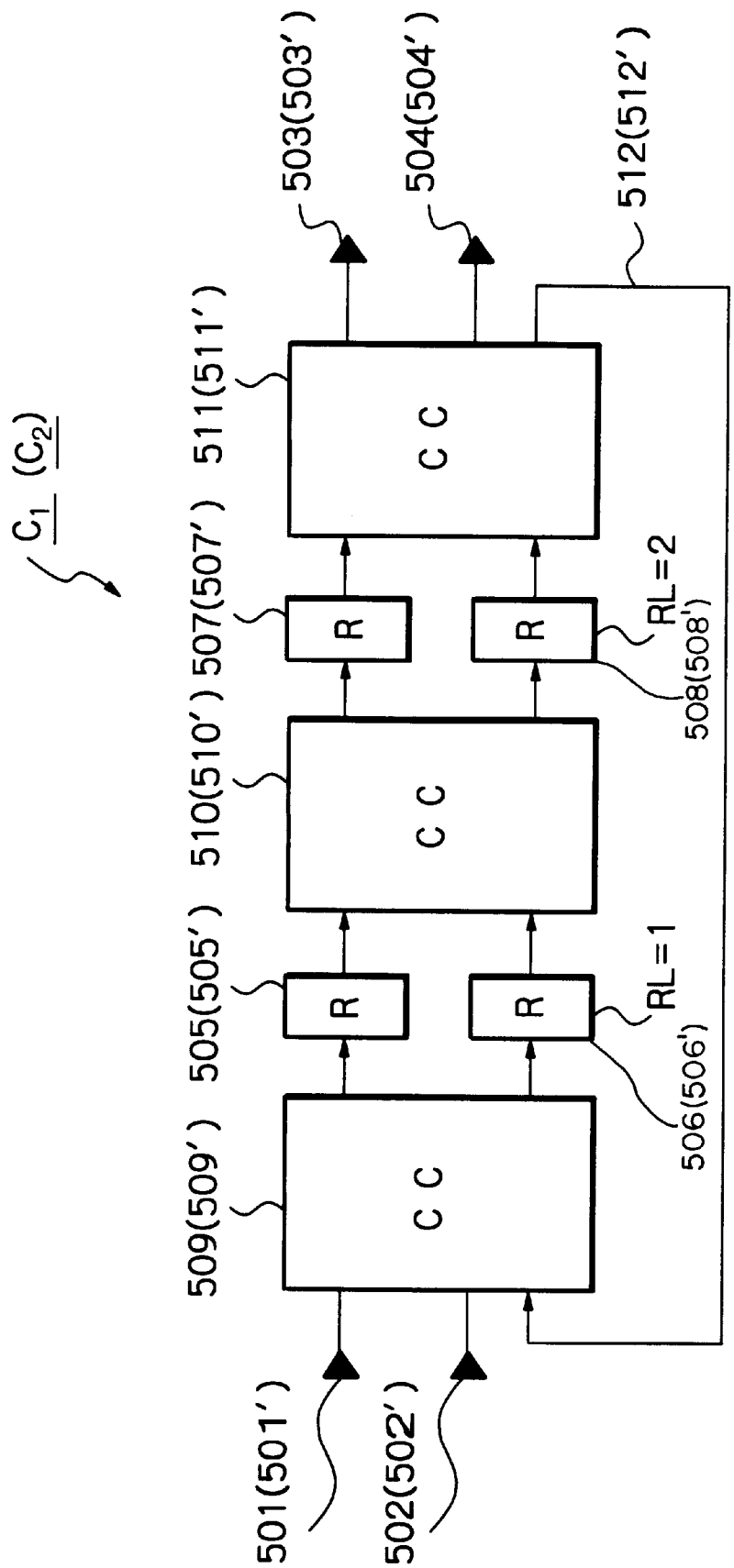
FIG. 5 is a block circuit diagram of a sequential circuit for explaining the flowchart of FIG. 3.

However, if the logic equivalence verifying routine of FIG. 3 is forcibly applied to a sequential circuit having a feedback loop as illustrated in FIG. 5, the register correspondence processing time is increased. That is, in FIG. 5, reference numerals 501 and 502 (501' and 502') designates external input terminals, 503 and 504 (503' and 504') designate external output terminals, 505 to 508 (505' to 508') designate registers, 509, 510 and 511 (509', 510' and 511') designate combination circuits, and 512 (512') designates a feedback loop. In this case, due to the presence of the feedback loop 512 (512'), the inputs of the input cone (combination circuit 509 (509') of the registers 505 and 506 (505' and 506') of the register level RL=1 includes the registers 507 (507') and 508 (508') of the register level RL=2. Therefore, when a register correspondence of the registers 505 and 506 (505' and 506') is made by steps 303 through 308 of FIG. 3, the register correspondence of the registers 507 and 508 (507' and 508') are not determined. As a result, in order to make a register correspondence in the register level RL=1 between the circuit information $C_1$ and $C_2$, provisional correspondence of the inputs of the combination circuit 509 (509') with the registers 507 and 508 (507' and 508') is made in advance. Note that if it is difficult to automatically make such provisional correspondence, it may be made manually. Also, if the provisional correspondence is not suitable so that the register correspondence of the registers 505 and 506 (505' and 506') fails, the provisional correspondence has to be changed. Thus, all possible provisional correspondences may be made, which increases the register correspondence processing time. For example, if the number of registers in the register level RL=2 is N, the number of all the possible provisional correspondences is N !. In addition, the larger the number of feedback loops, the larger the number of provisional correspondence processes, which further increases the register correspondence processing time.

Figure 6A:
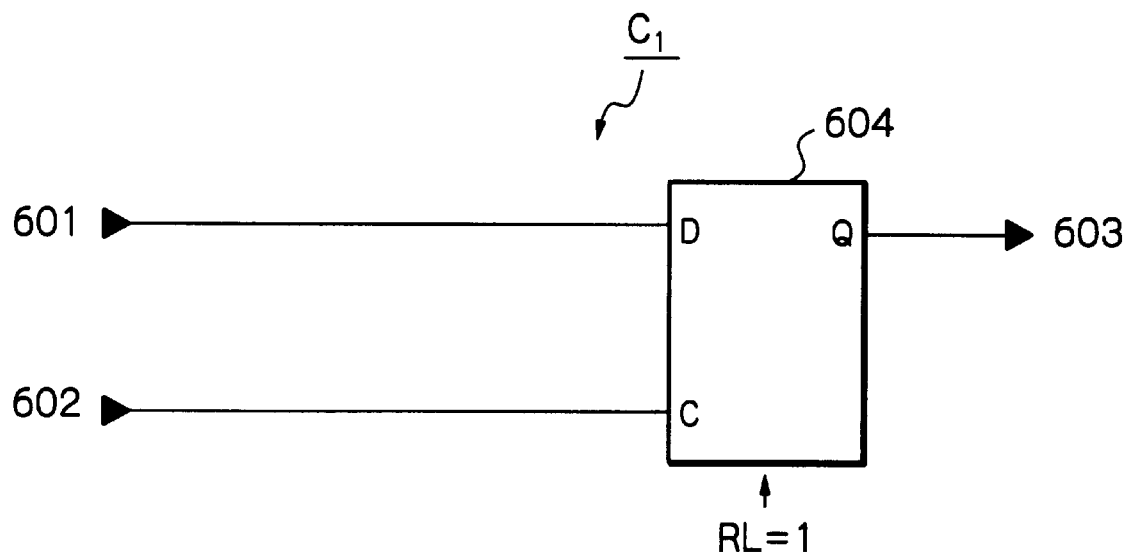
FIG. 6A and 6B are block circuit diagrams of sequential circuits for explaining the flowchart of FIG. 3.

Further, in the register correspondence routine of FIG. 3, if test circuits are added in the circuit information $C_2$, it is impossible to make a register correspondence. For example, as illustrated in FIG. 6A, the circuit information $C_1$ includes external input terminals 601 and 602, an external output terminal 603, and a register (D-type flip-flop) 604. On the other hand, the circuit information $C_2$ includes external input terminals 601' and 602', an external output terminal 603', and a register (D-type flip-flop) 604'. In addition, the circuit information $C_2$ includes test external input terminals 605, 606 and 607, a combination circuit (multiplexer) 608, and a combination circuit (buffer) 609. Therefore, in FIG. 6B, if "1" is set in the test external input terminal 605, the register 604' is reset, i.e., the content of the register 604' becomes "0". In this state, if "1" is set in the test external input terminal 607, the circuit of FIG. 6B enters a test mode, so that data at the test external input terminal 606 is supplied via the multiplexer 608 to the flip-flop 604'.

Figure 6B:
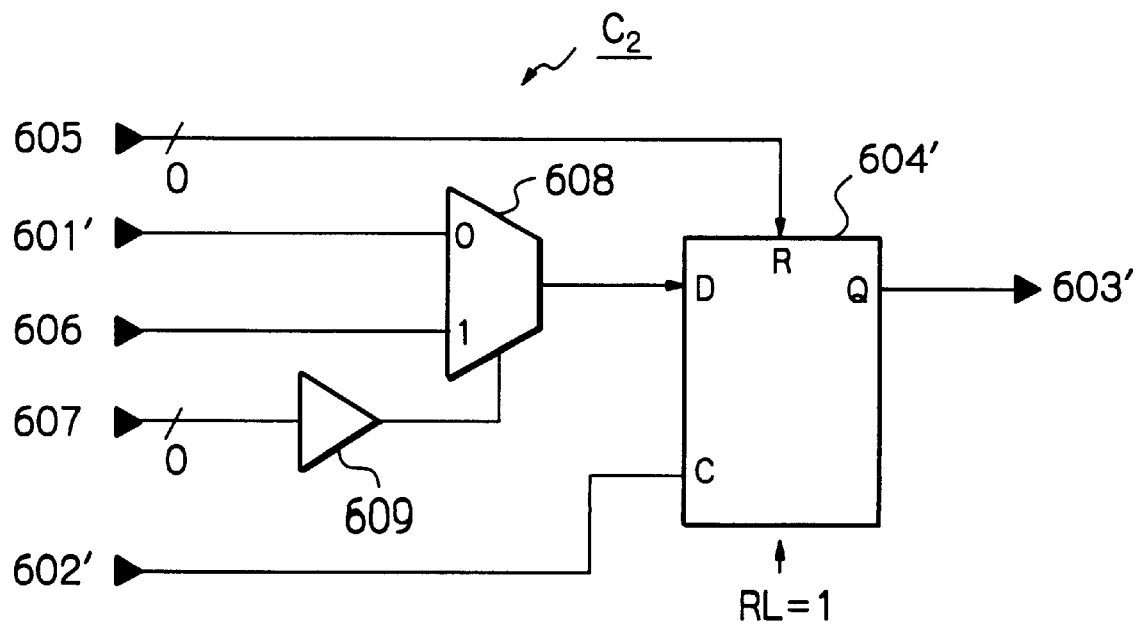

In order to make a register correspondence between the flip-flop 604 of FIG. 6A and the flip-flop 604' of FIG. 6B, "0" is set in the test external input terminals 605 and 607. Even in this state, since the inputs of an input cone of the data input of the flip-flop 604 are (601), while the inputs of an input cone of the data input of the flip-flop 604' are (601', 606), it is impossible to make a register correspondence therebetween.

Figure 7A:
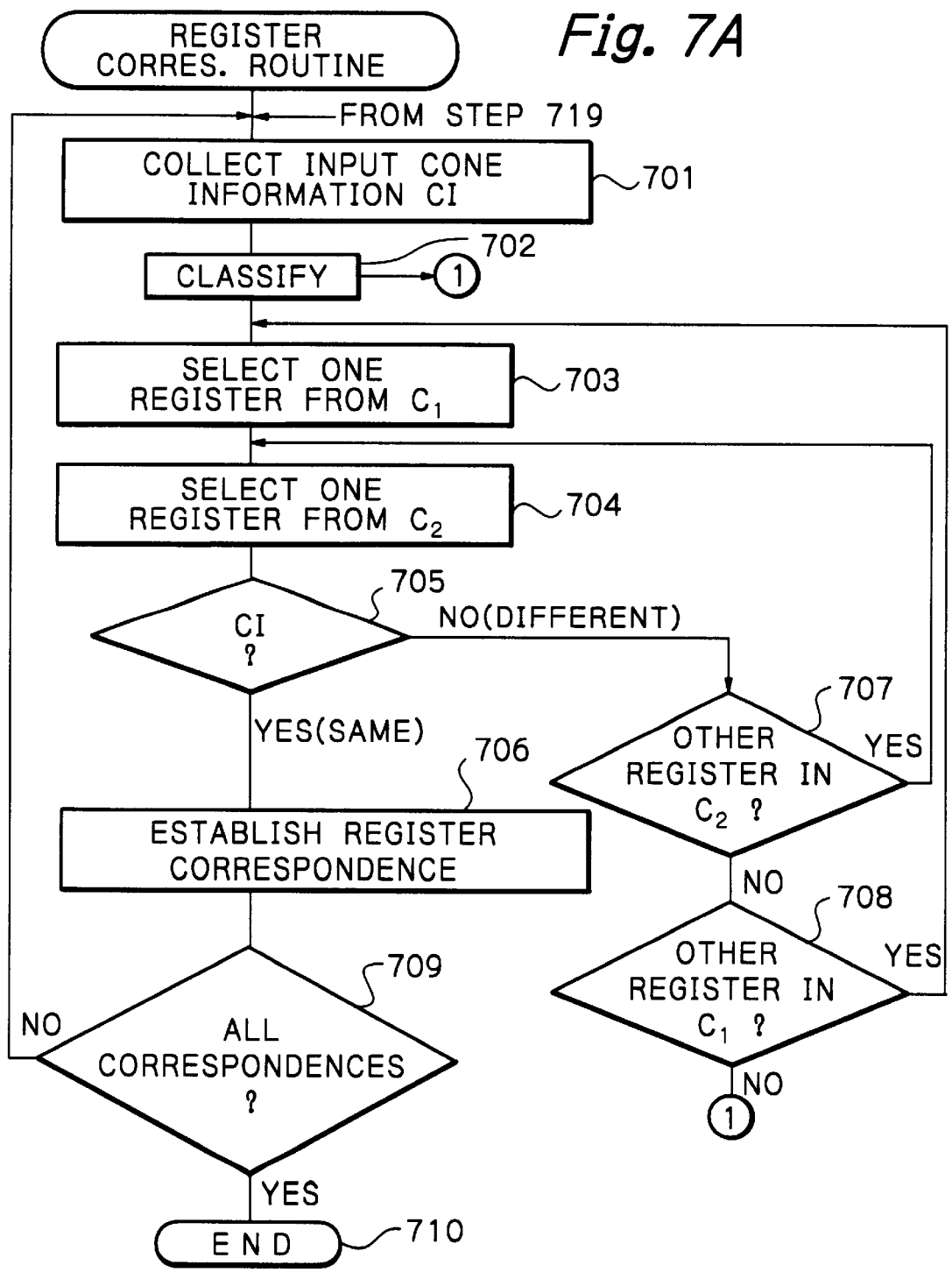
FIGS. 7A and 7B are flowcharts illustrating a first embodiment of the register correspondence method in a logic equivalence verifying system according to the present invention.
Figure 7B:
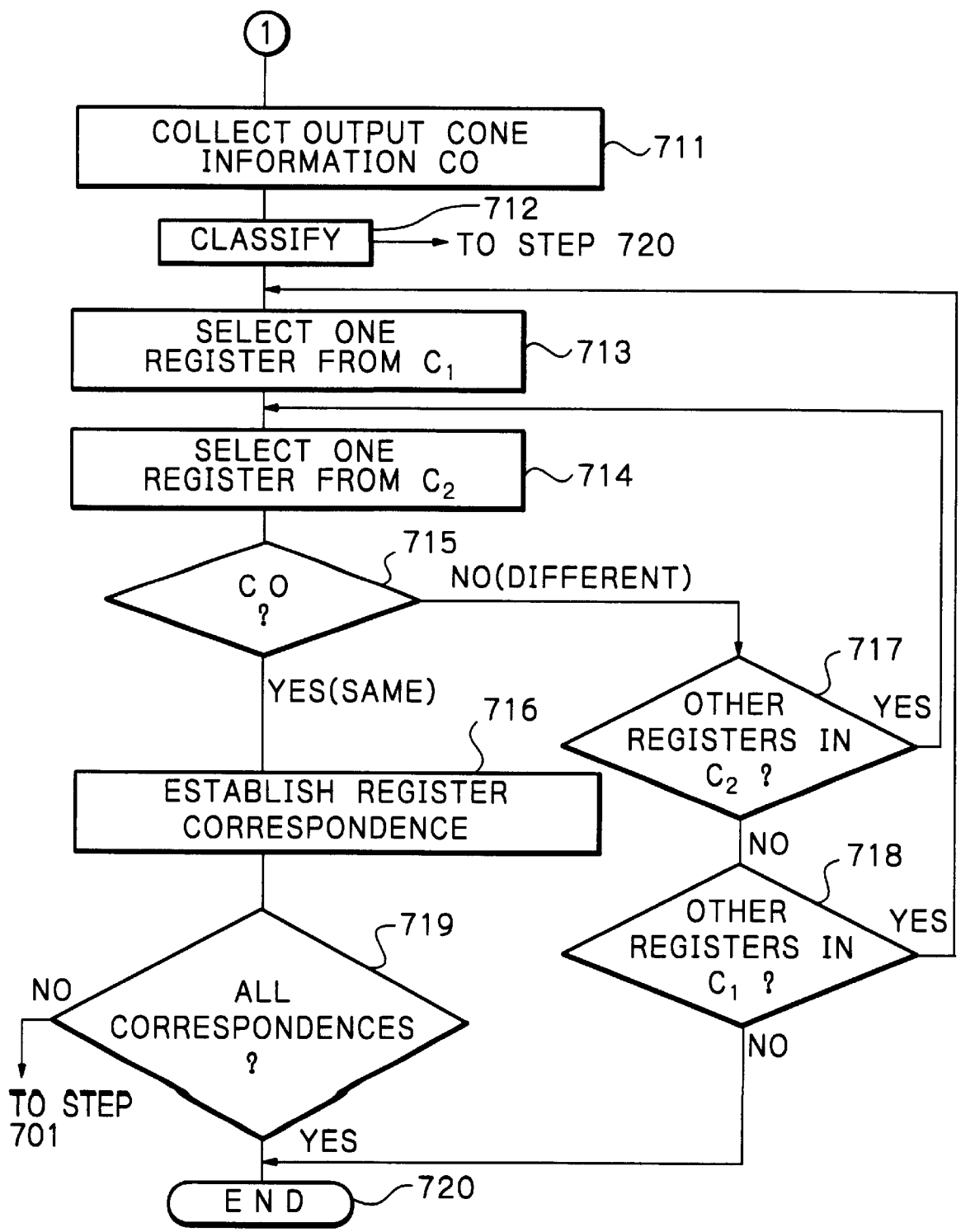

FIGS. 7A and 7B are flowcharts illustrating a first embodiment of the register correspondence method according to the present invention.

First, at step 701, input cone information for each register is collected. Input cone information CI for one undetermined register R is generally represented by CI = {(external input terminals),
(determined registers),
(undetermined registers),
(presence or absence of a self-feedback loop) }

Note that "1" designates the presence of a self-feedback loop, and "0" designates the absence of a self-feedback loop.

For example, as illustrated in FIG. 8, assume that a register 801 has an input cone (combination circuit) 802 and an output cone (combination circuit) 803. Also, external input terminals 804 and 805, a determined register 806 and an undetermined register 807 are connected to the input cone 802, and external output terminals 808 and 809, a determined register 810 and a undetermined register 811 are connected to the input cone 803. In this case, input cone information CI for the register 801 is represented by
CI(801)={(804,805), (806), (807), 1}

Next, at step 702, the registers of the circuit information $C_1$ and $C_2$ are classified into groups I and II as shown in FIG. 9. Note that the group I includes subgroup "a", "b" and "c", and the group II includes subgroups "d" and "e". It is clear that it is impossible to make a register correspondence between the registers of the group II. In this case, it is possible to make a register correspondence between the registers between the group I.

Next, at step 703, one register which is not determined is selected from the circuit information $C_1$ (the group I). Also, at step 704, one register which is not determined is selected from the circuit information $C_2$ (the group I).

At step 705, it is determined whether or not the input cone information CI of the selected register of the circuit information $C_1$ is the same as the input cone information CI of the selected register of the circuit information $C_2$. Step 705 is illustrated in detail in FIG. 10. That is, at step 1001, it is determined whether or not the external input terminals of the selected register of the circuit information $C_1$ are the same as those of the selected register of the circuit information $C_2$. At step 1002, it is determined whether or not the determined registers of the input cone of the selected register of the circuit information $C_1$ are the same as those of the input cone of the selected register of the circuit information $C_2$. At step 1003, it is determined whether or not the number of the undetermined registers of the input cone of the selected register of the circuit information $C_1$ are the same as that of undetermined registers of the input cone of the selected register of the circuit information $C_2$. At step 1004, it is determined whether or not the presence or absence of a self-feedback loop of the selected register of the circuit information $C_1$ coincides with the presence or absence of a self-feedback loop of the selected register of the circuit information $C_2$. As a result, if all the determinations at steps 1001 through 1004 are affirmative, the control proceeds to step 706. Contrary to this, if at least one of the determinations at steps 1001 through 1004 is negative, the control proceeds to step 707.

At step 706, a correspondence between the selected register of the circuit information $C_1$ and the selected register of the circuit information $C_2$ is established. In other words, the two selected registers are determined.

Step 707 repeats the operation at steps 704 and 705 for other non-selected registers of the circuit information $C_2$ (group I). Also, step 708 repeats the operation at steps 703 through 707 for other non-selected registers of the circuit information $C_1$ (group I).

At step 709, it is determined whether or not all the registers of the circuit information $C_1$ and $C_2$ (group I) are determined. As a result, if all the registers are determined, the control proceeds to step 710, thus completing this routine. Otherwise, the control returns to step 701.

On the other hand, when no register correspondence is finally established, the control proceeds to step 711.

At step 711, output cone information for each register is collected. Output cone information CO for one undetermined register R is generally represented by CO = {(external output terminals),
(determined registers),
(undetermined registers),
(presence or absence of a self-feedback loop) }

Note that "1" designates the presence of a self-feedback loop, and "0" designates the absence of a self-feedback loop.

For example, output cone information CO for the register 801 of FIG. 8 is represented by
CO(801)={(808,809), (810), (811), 1}

Next, at step 712, in the same way as at step 702, the registers of the circuit information $C_1$ and $C_2$ are classified into groups I and II as shown in FIG. 9. In this case, it is possible to make a register correspondence between only the registers belonging to the group I.

Next, at step 713, one register which is not determined is selected from the circuit information $C_1$ (the group I). Also, at step 714, one register which is not determined is selected from the circuit information $C_2$ (the group I).

Figure 11:
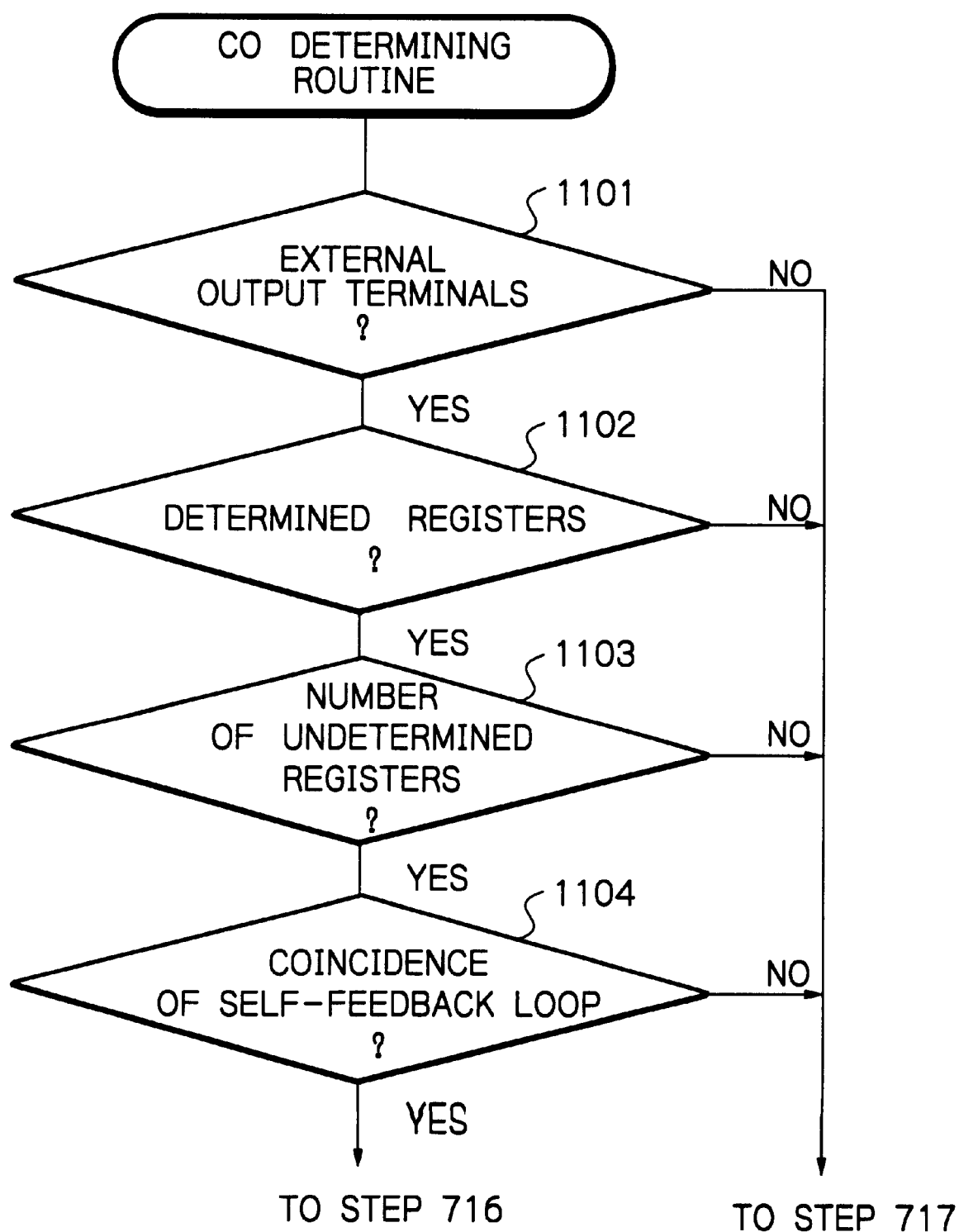
FIG. 11 is a detailed flowchart of the output cone information comparing steps of FIG. 7B.

At step 715, it is determined whether or not the output cone information CO of the selected register of the circuit information $C_1$ is the same as the output cone information CO of the selected register of the circuit information $C_2$ (see subgroup "c" of FIG. 9). Step 715 is illustrated in detail in FIG. 11. That is, at step 1101, it is determined whether or not the external output terminals of the selected register of the circuit information $C_1$ are the same as those of the selected register of the circuit information $C_2$. At step 1102, it is determined whether or not the determined registers of the output cone of the selected register of the circuit information $C_1$ are the same as those of the output cone of the selected register of the circuit information $C_2$. At step 1103, it is determined whether or not the number of the undetermined registers of the output cone of the selected register of the circuit information $C_1$ is the same as that of undetermined registers of the output cone of the selected register of the circuit information $C_2$. At step 1104, it is determined whether or not the presence or absence of a self-feedback loop of the selected register of the circuit information $C_1$ coincides with the presence or absence of a self-feedback loop of the selected register of the circuit information $C_2$. As a result, if all the determinations at steps 1101 through 1104 are affirmative, the control proceeds to step 716. Contrary to this, if at least one of the determinations at steps 1101 through 1104 is negative, the control proceeds to step 717.

At step 716, a correspondence between the selected register of the circuit information $C_1$ and the selected register of the circuit information $C_2$ is established. In other words, the two selected registers are determined.

Step 717 repeats the operation at steps 714 and 715 for other non-selected registers of the circuit information $C_2$ (group I). Also, step 718 repeats the operation at steps 713 through 717 for other non-selected registers of the circuit information $C_1$ (group I).

At step 719, it is determined whether or not all the registers of the circuit information $C_1$ and $C_2$ (group I) are determined. As a result, if all the registers are determined, the control proceeds to step 720, thus completing this routine. Otherwise, the control returns to step 701.

On the other hand, when no register correspondence is finally established, the control proceeds to step 720.

Figure 10:
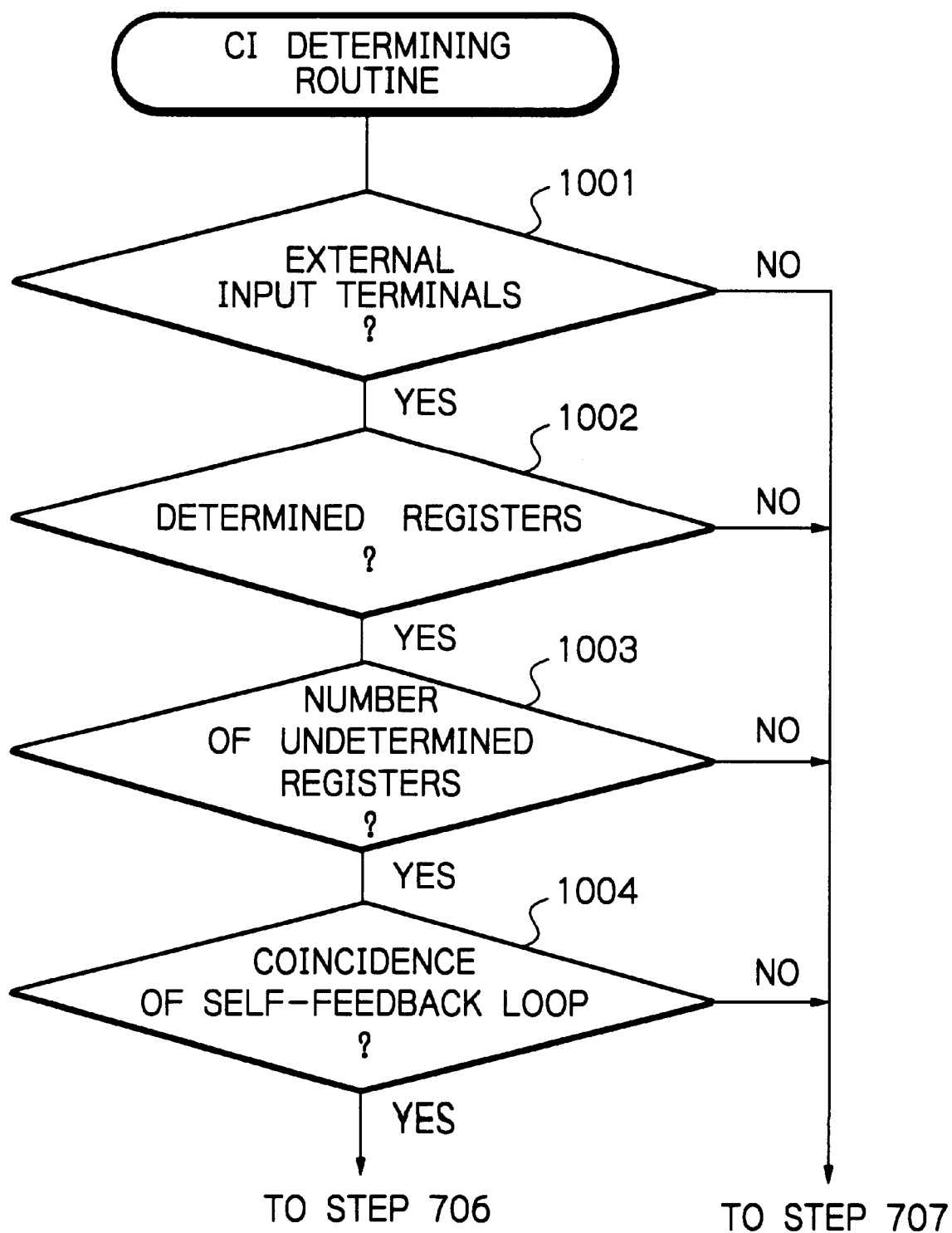
FIG. 10 is a detailed flowchart of the input cone information comparing steps of FIG. 7A.

Note that the classifying step at 702 is carried out by a similar routine to the routine of FIG. 10. In this case, this routine is carried out among the registers within the circuit information $C_1$ and among the registers within the circuit information $C_2$. Also, the classifying step at 712 is carried out by a similar routine to the routine of FIG. 11. In this case, this routine is carried out among the registers within the circuit information $C_1$ and among the registers within the circuit information $C_2$.

The routine of FIGS. 7A and 7B is further explained with reference to FIGS. 12A, 12B and 12C.

Figure 12A:
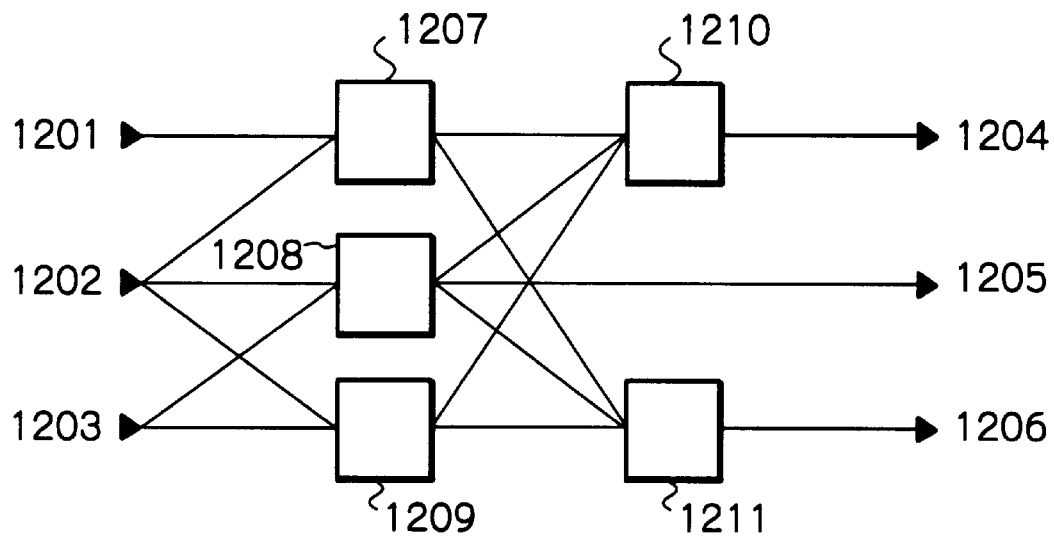
FIGS. 12A, 12B and 12C are block circuit diagrams for explaining the flowcharts of FIGS. 7A and 7B.

In FIG. 12A, which illustrates a first example of the circuit information $C_1$ (or $C_2$), external input terminals 1201, 1202 and 1203, external output terminals 1204, 1205 and 1206, and registers 1207 to 1211 are illustrated. In this case, input cone information CI for each register collected at step 701 of FIG. 7A is as follows:
CI (1207)={(1201, 1202), (), (), 0}
CI (1208)={(1202, 1203), (), (), 0}
CI (1209)={(1202, 1203), (), (), 0}
CI (1210)={(), (),(1207, 1208, 1209), 0}
CI (1211)={(), (),(1207, 1208, 1209), 0}

The registers 1207 through 1211 are classified at step 702 of FIG. 7A into a group of the register 1207, a group of the registers 1208 and 1209, and a group of the registers 1210 and 1211. In this case, only the group comprised of the register 1207 belongs to the group I of FIG. 9, while the group of the registers 1208 and 1209 and the group of the registers 1210 and 1211 belong to the group II of FIG. 9. In other words, the register 1207 is unique. Therefore, only the register 1207 is determined by steps 703, 704, 705 and 706. At this stage, there are undetermined registers 1208 through 1211. Therefore, the control returns to step 701. In this case, since the register 1207 is determined, input cone information CI for each register collected at step 701 of FIG. 7A is as follows:
CI (1208)={(1202, 1203), (), (), 0}
CI (1209)={(1202, 1203), (), (), 0}
CI (1210)={(), (1207),(1208, 1209), 0}
CI (1211)={(), (1207),(1208, 1209), 0}

The registers 1208 through 1211 are classified at step 702 of FIG. 7A into a group of the registers 1208 and 1209 and a group of the registers 1210 and 1211. In this case, the group of the registers 1208 and 1209 and the group of the registers 1210 and 1211 belong to the group II of FIG. 9. In other words, there is no unique register any more. Therefore, since no register correspondence occurs, the control proceeds directly to step 711. At this stage, there are undetermined registers 1208 through 1211. Therefore, output cone information CO for the registers 1208 through 1211 collected at step 711 of FIG. 7B is as follows:
CO (1208)={(1205, (), (1210, 1211), 0}
CO (1209)={(), (), (1210, 1211), 0}
CO (1210)={(1204), (), (), 0}
CO (1211)={(1206), (), (), 0}

The registers 1208 through 1211 are classified at step 712 of FIG. 7B into a group comprised of the register 1208, a group comprised of the register 1209, a group comprised of the register 1210, and a group comprised of the register 1211. In this case, all the groups belongs to the group I of FIG. 9.

In other words, all the registers 1208 through 1211 are unique. Therefore, all the registers 1208 through 1211 can be determined by steps 713, 714, 715 and 716. At this stage, there is no undetermined register. Therefore, the control proceeds to step 720.

Figure 12B:
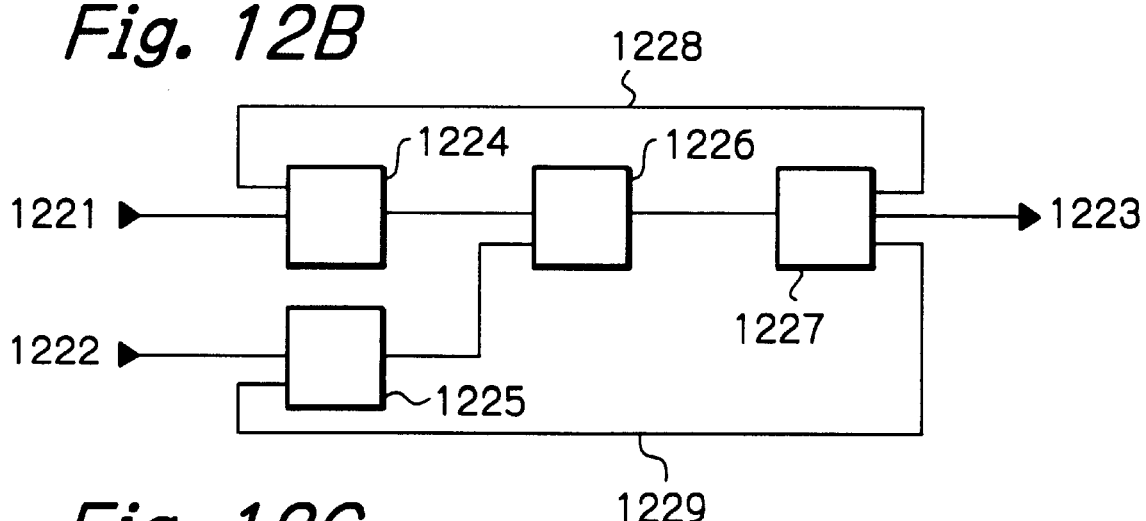

In FIG. 12B, which illustrates a second example of the circuit information $C_1$ (or $C_2$), external input terminals 1221 and 1222, an external output terminal 1223, registers 1224 to 1227 and feedback loops 1228 and 1229 are illustrated. In this case, input cone information CI for each register collected at step 701 of FIG. 7A is as follows:
CI (1224)={(1221), (), (1227), 0}
CI (1225)={(1222), (), (1227), 0}
CI (1226)={(), (), (1224, 1225), 0}
CI (1227)={(), (),(1226), 0}

The registers 1224 through 1227 are classified at step 702 of FIG. 7A into a group comprised of the register 1224, a group of the register 1227, a group comprised of the register 1226, and a group comprised comprised of the register 1227. In this case, all the groups belong to the group I of FIG. 9. In other words, all the registers 1224 through 1228 are unique. Therefore, the registers 1224 through 1228 are determined by steps 703, 704, 705 and 706. At this stage, there is no undetermined register through 1211. Therefore, the control proceeds to step 710.

Thus, even if the circuit information $C_1$ and $C_2$ include a feedback loop, it is determined that there is a register correspondence therebetween.

Figure 12C:
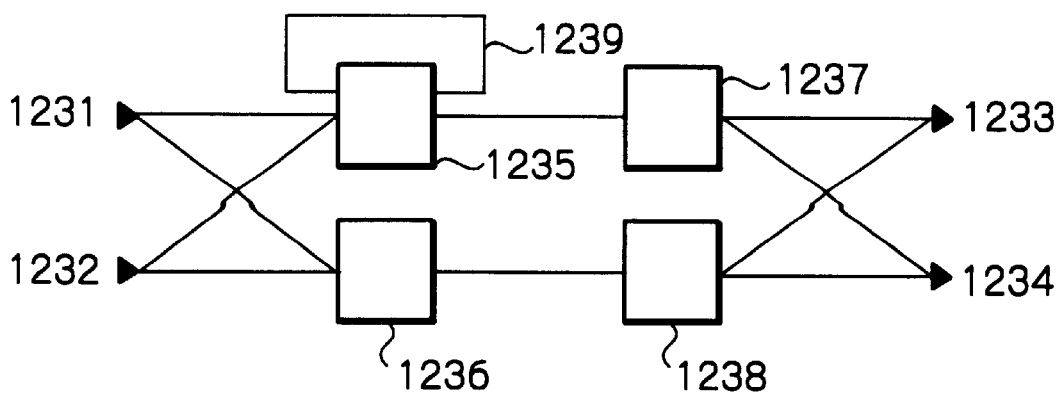

In FIG. 12C, which illustrates a third example of the circuit information $C_1$ (or $C_2$), external input terminals 1231 and 1232, external output terminals 1233 and 1234, and registers 1235 to 1238 and a self-feedback loop 1239 are illustrated. In this case, input cone information CI for each register collected at step 701 of FIG. 7A is as follows:
CI (1235)={(1231, 1232), (), (), 1}
CI (1236)={(1231, 1232), (), (), 0}

CI (1237)={(), (), (1235), 0}
CI (1238)={(), (),(1236), 0}

The registers 1235 through 1236 are classified at step 702 of FIG. 7A into a group comprised of the register 1235, a group comprised of the register 1236, a group comprised of the registers 1237 and 1238. In this case, the group comprised of the register 1236 and the group comprised of the register 1237 belong to the group I of FIG. 9, while the group of the registers 1237 and 1238 belong to the group II of FIG. 9. Therefore, the registers 1235 and 1236 are determined by steps 703, 704, 705 and 706. At this stage, there are undetermined registers 1237 through 1238. Therefore, the control returns to step 701. In this case, since the registers 1235 and 1236 are determined, input cone information CI for each register collected at step 701 of FIG. 7A is as follows:

CI (1237)={(), (1235),(), 0}
CI (1238)={(), (1236),(), 0}

The registers 1237 and 1238 are classified at step 702 of FIG. 7A into a group comprised of the register 1237 and a group comprised of the register 1238 which both belong to the group I of FIG. 9. Therefore, the registers 1237 and 1238 are determined by steps 703, 704, 705 and 706. At this stage, there is no undetermined register. Therefore, the control proceeds to step 710.

Thus, even if the circuit information $C_1$ and $C_2$ include a self-feedback loop, it is determined there is a register correspondence therebetween.

Figure 13:
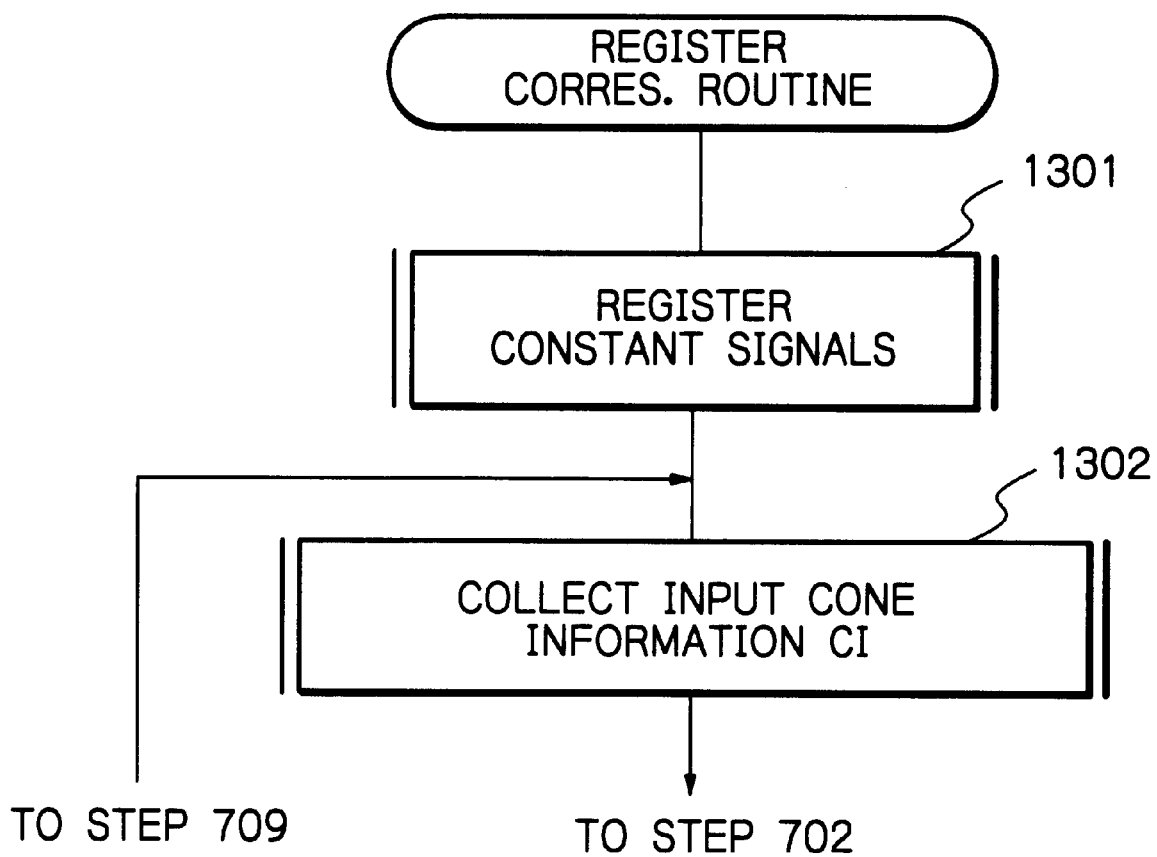
FIG. 13 is a flowchart illustrating a second embodiment of the register correspondence method in a logic equivalence verifying system according to the present invention.
Figure 14A:
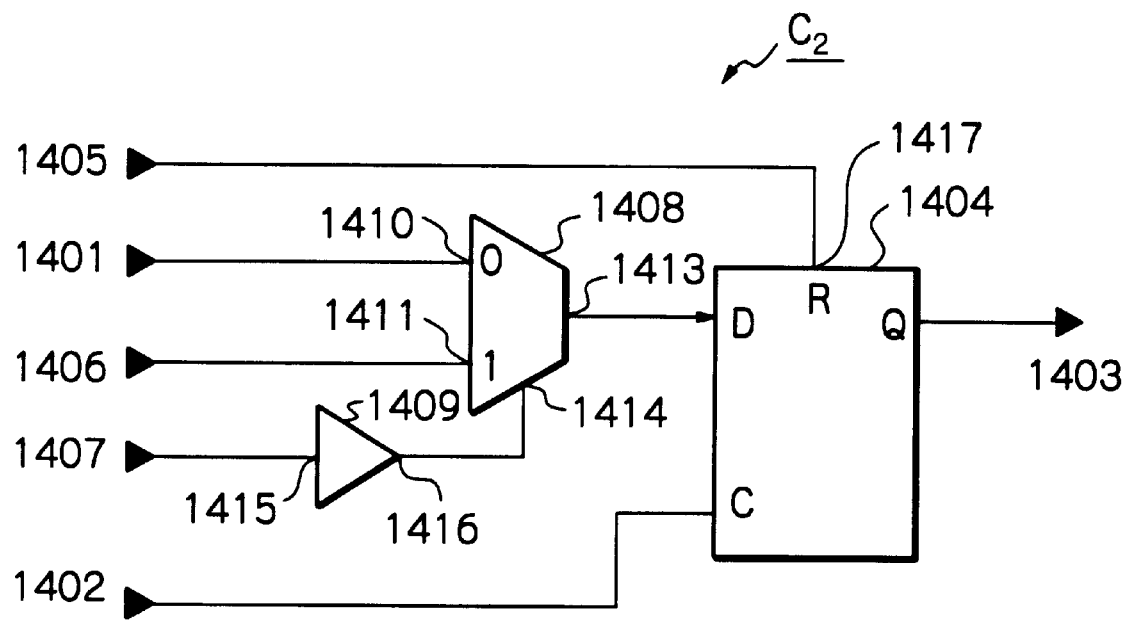
FIGS. 14A and 14B are block circuit diagrams for explaining the flowcharts of FIG. 13.

In FIG. 13, which is a flowchart illustrating a second embodiment of the register correspondence method according to the present invention, step 1301 is added to the routine of FIGS. 7A and 7B, and step 702 is modified to step 1302, thus processing a circuit information as illustrated in FIG. 14A which is the same as FIG. 6B where test circuits are included.

That is, step 1301, constant signals are registered, and at step 1302, an input cone information is determined. Then, the control proceeds to step 702 of FIG. 7A.

Figure 15A:
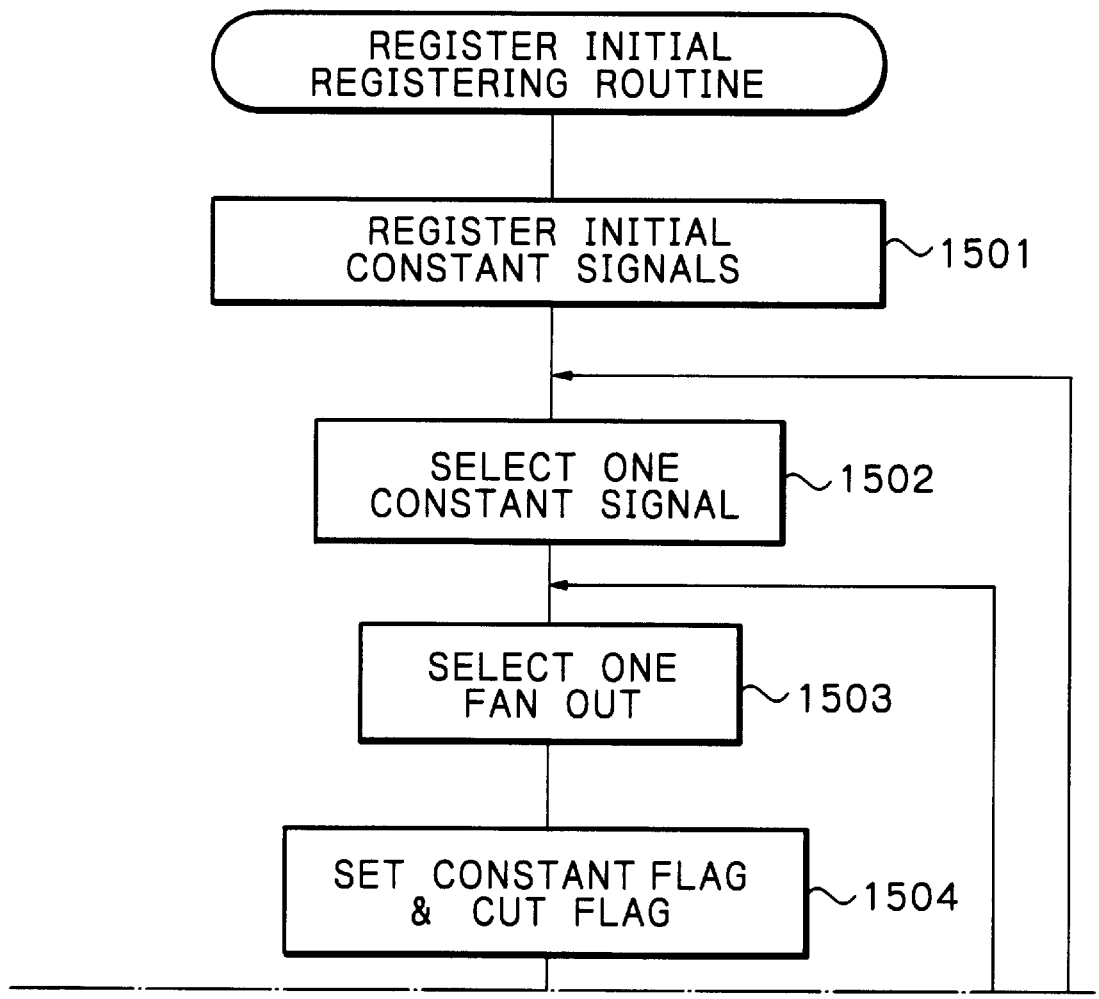
FIGS. 15A and 15B are detailed flowchart of the constant signal registering step of FIG. 13.
Figure 15B:
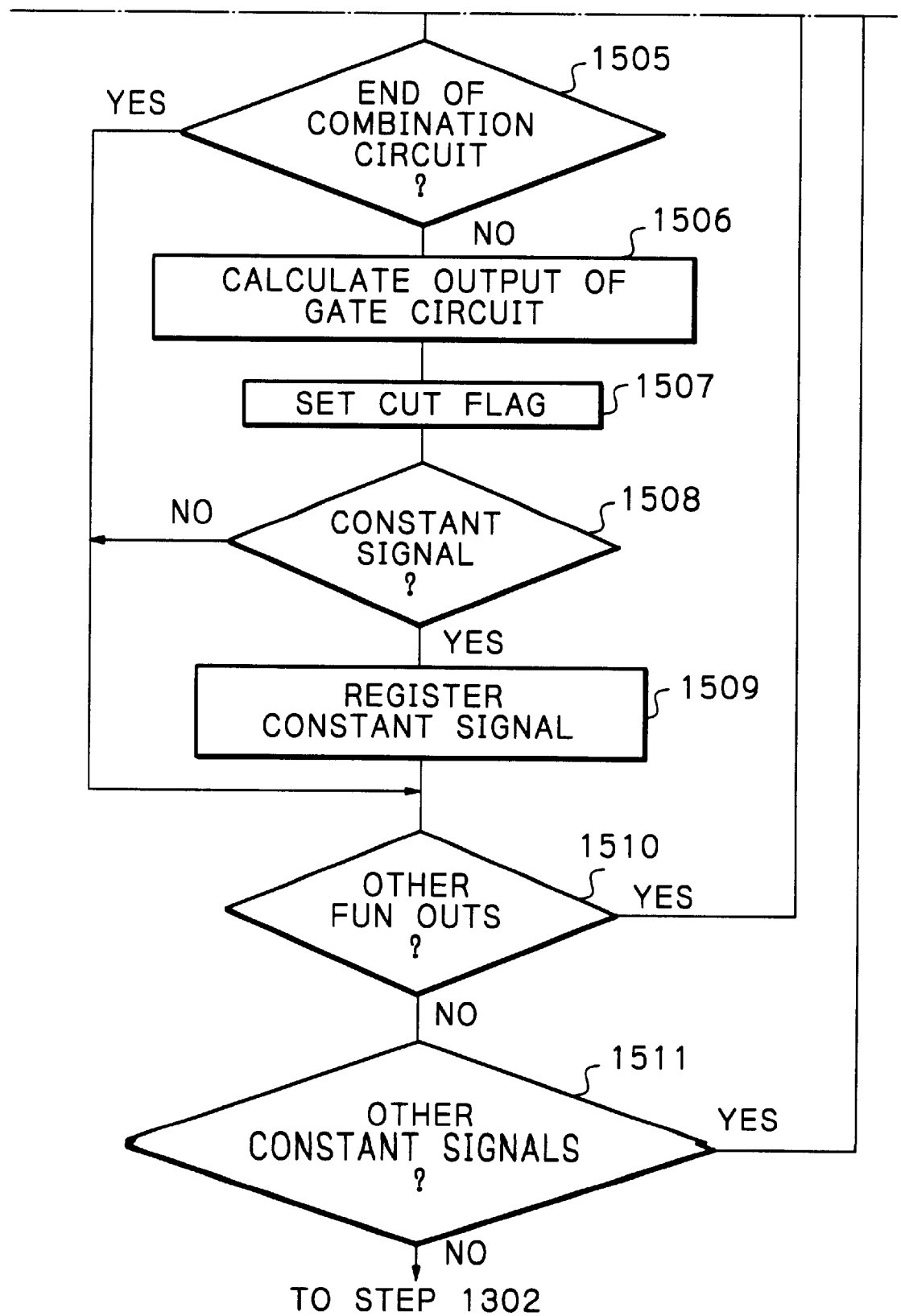
Figure 16:
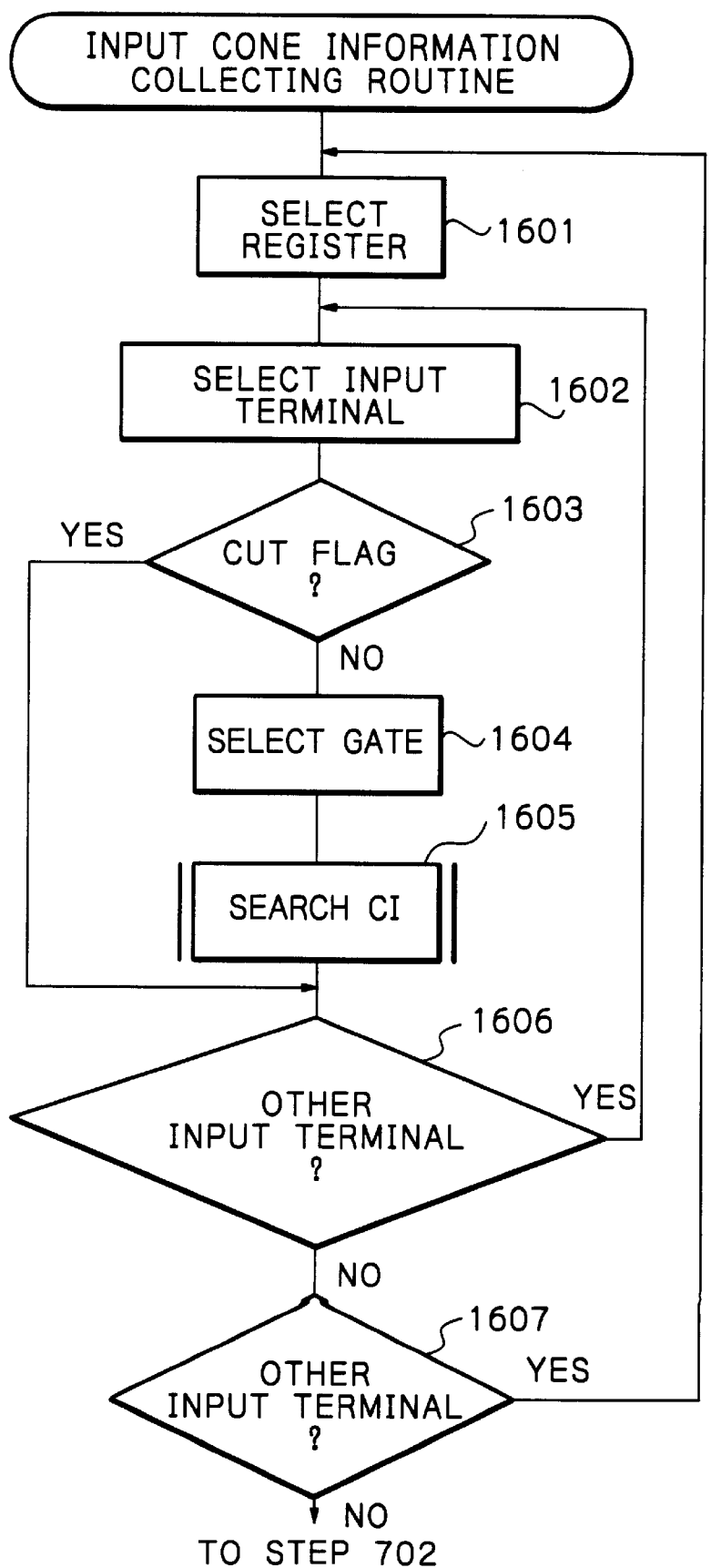
FIG. 16 is a detailed flowchart of the input cone information collecting step of FIG. 13.
Figure 17B:
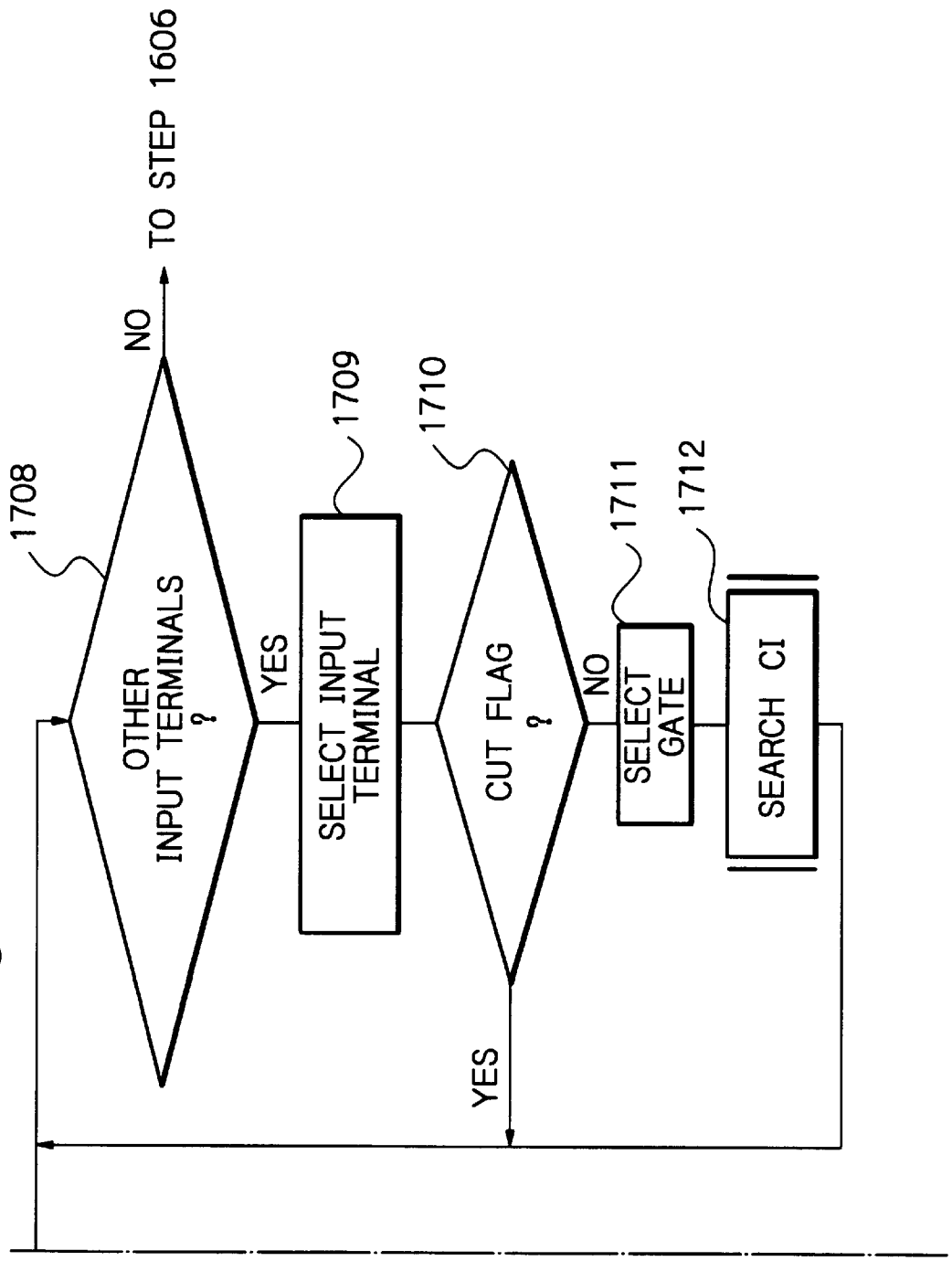

Step 1301 is illustrated in detail in FIG. 15, and step 1302 is illustrated in FIGS. 16 and 17.

First, at step 1501, initial constant signals to the input terminals within the circuit information $C_2$ are registered.

Next, at step 1502, one of the registered constant signals is selected.

Next, at step 1503, one of the fanouts of the selected constant signal, i.e., a gate circuit is selected.

Next, at step 1504, a constant flag and a cut flag are set in the selected gate circuit.

Next, at step 1505, it is determined whether or not the selected gate circuit is an end point of a combination circuit. If the selected gate circuit is an end point of a combination, the control proceeds directly to step 1510. Otherwise, the control proceeds to step 1506.

At step 1506, an output logic of the selected gate circuit is calculated in accordance with the constant flag set in the input thereof.

Next, at step 1507, if the input of the gate circuit is unnecessary, a cut flag is set therein.

Next, at steps 1508 and 1509, only when the output of the gate circuit is a constant signal, is the constant signal registered.

Step 1510 repeats the operation at steps 1503 through 1509 for other non-selected fanouts of the selected constant signal.

Step 1511 repeats the operation at steps 1502 through 1510 for other non-selected constant signals.

Figure 14B:
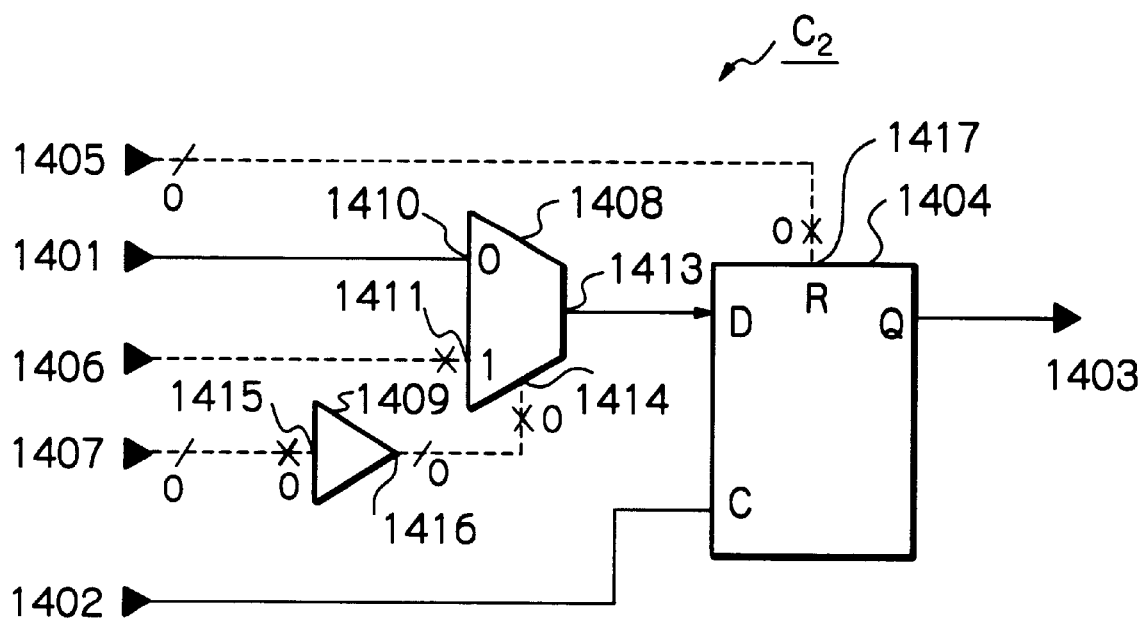

For example, referring to FIG. 14B, signals at a test reset terminal 1405 and a test control terminal 1407 are caused to be initial constant signals "0" and are registered at step 1501. Then, the constant signal "0" of the test reset terminal 1405 is selected at step 1502, and the reset terminal 1417 of the flip-flop 1404 is selected at step 1503. Then, a constant flag "0" and a cut flag are set in the reset terminal 1417 of the flip-flop 1404 at step 1504. Since the reset terminal 1417 of the flip-flop 1504 is an end point of a combination circuit (not shown), the control proceeds from step 1505 to step 1510. Also, in this case, since there is no other fanout for the test reset terminal 1405, the control further proceeds to step 1511 and then returns to step 1502.

Next, the constant signal "0" of the test control terminal 1407 is selected at step 1502, and the input terminal 1415 of a buffer (combination circuit) 1409 is selected at step 1503. Then, a constant flag "0" and a cut flag are set in the input terminal 1415 of the buffer 1409 at step 1504. Since the input terminal 1415 of the buffer 1409 is not an end position of a combination circuit, the control proceeds from step 1505 to step 1506 which calculates the logic of the output terminal 1416 of the buffer 1409 in accordance with the value of the input terminal thereof. In this case, the output terminal 1416 is "0". Then, since the input terminal 1415 of the buffer 1409 is unnecessary, a cut flag is set therein at step 1507. Then, since the output terminal 1416 has a constant signal "0", this constant signal "0" is registered at steps 1508 and 1509. Then, if there is no other fanout, the control returns from step 1511 to step 1502.

Next, the newly set constant signal "0" of the output terminal 1409 of the buffer 1416 is selected at step 1502, and the control terminal 1414 of a multiplexer (combination circuit) 1408 is selected at step 1503. Then, a constant flag "0" and a cut flag are set in the control terminal 1414 of the multiplexer 1408 at step 1504. Since the control terminal 1414 of the multiplexer 1408 is not an end position of a combination circuit, the control proceeds from step 1505 to step 1506 which calculates the logic of the output terminal 1413 of the multiplexer 1408 in accordance with the value of the input terminal thereof. In this case, the logic of the output terminal 1413 is the same as that of the input terminal 1401. Then, since the control terminals 1411 and 1414 of the multiplexer 1408 are unnecessary, a cut flag is set therein at step 1507. Then, since the output terminal 1413 does not have a constant signal, the control proceeds directly to step 1510. Then, if there is no other fanout and no other constant signal, the control proceeds to step 1302.

Step 1302 of FIG. 13 is explained next with reference to FIGS. 16 and 17.

First, at step 1601, one register is selected from circuit information such as $C_2$.

Next, at step 1602, one input terminal is selected from the circuit information.

Next, at step 1603, it is determined whether or not the selected input terminal has a cut flag. If the selected input terminal has a cut flag, the control proceeds directly to step 1606. Otherwise, the control proceeds to step 1604.

At step 1604, a gate connected to the selected input terminal is selected. Then, at step 1605, a sub routine "SEARCH CI" is called as an argument of the selected gate.

Step 1606 repeats the operation at steps 1602 through 1605 for other non-selected input terminals.

Step 1607 repeats the operation at steps 1601 through 1606 for other non-selected registers.

The subroutine "SEARCH CI" at step 1605 of FIG. 16 is explained next with reference to FIG. 17. Note that the subroutine "SEARCH CI" is a recursive subroutine.

First, at step 1701, it is determined whether or not the selected gate is already processed by its associated flag. If the selected gate is already processed, the control returns to step 1606 of FIG. 16. Otherwise, the control proceeds to step 1702 which sets the associated flag of the selected gate.

Next, at step 1703, it is determined whether the selected gate is an external input terminal or a register. If the selected gate is an external input terminal, the control proceeds to step 1704 which registers the selected gate as an external input terminal of the input cone. If the selected gate is a register, the control proceeds to step 1705. Otherwise, the control proceeds to step 1708.

At step 1705, it is determined whether or not the selected gate is the selected register. If the selected gate is the selected register, the control proceeds to step 1706 which registers the presence of a self-feedback loop. If the selected gate is not the selected register, the control proceeds to step 1707 which registers the selected gate as a register of the input cone.

The control at steps 1704, 1706 and 1707 return to step 1606 of FIG. 16.

At step 1708, it is determined whether or not there is an input terminal to the gate. As a result, if there is, the control proceeds to step 1709. Otherwise, the control returns to step 1606 of FIG. 16.

At step 1709, one input terminal is selected from the circuit information

Next, at step 1710, it is determined whether or not the selected input terminal has a cut flag. If the selected input terminal has a cut flag, the control returns to step 1708. Otherwise, the control proceeds to step 1711.

At step 1711, a gate connected to the selected input terminal is selected. Then, at step 1712, a sub routine "SEARCH CI" is again called as an argument of the selected gate.

When the second embodiment as illustrated in FIGS. 13, 15, 16 and 17 is applied to the circuit information as illustrated in FIG. 14B, the input cone information CI of the register 1404 is

CI={(1401, 1402), (), (), 0}

Therefore, this input cone information CI can be made a correspondence with the circuit cone information CI as illustrated in FIG. 6A.

Figure 18B:
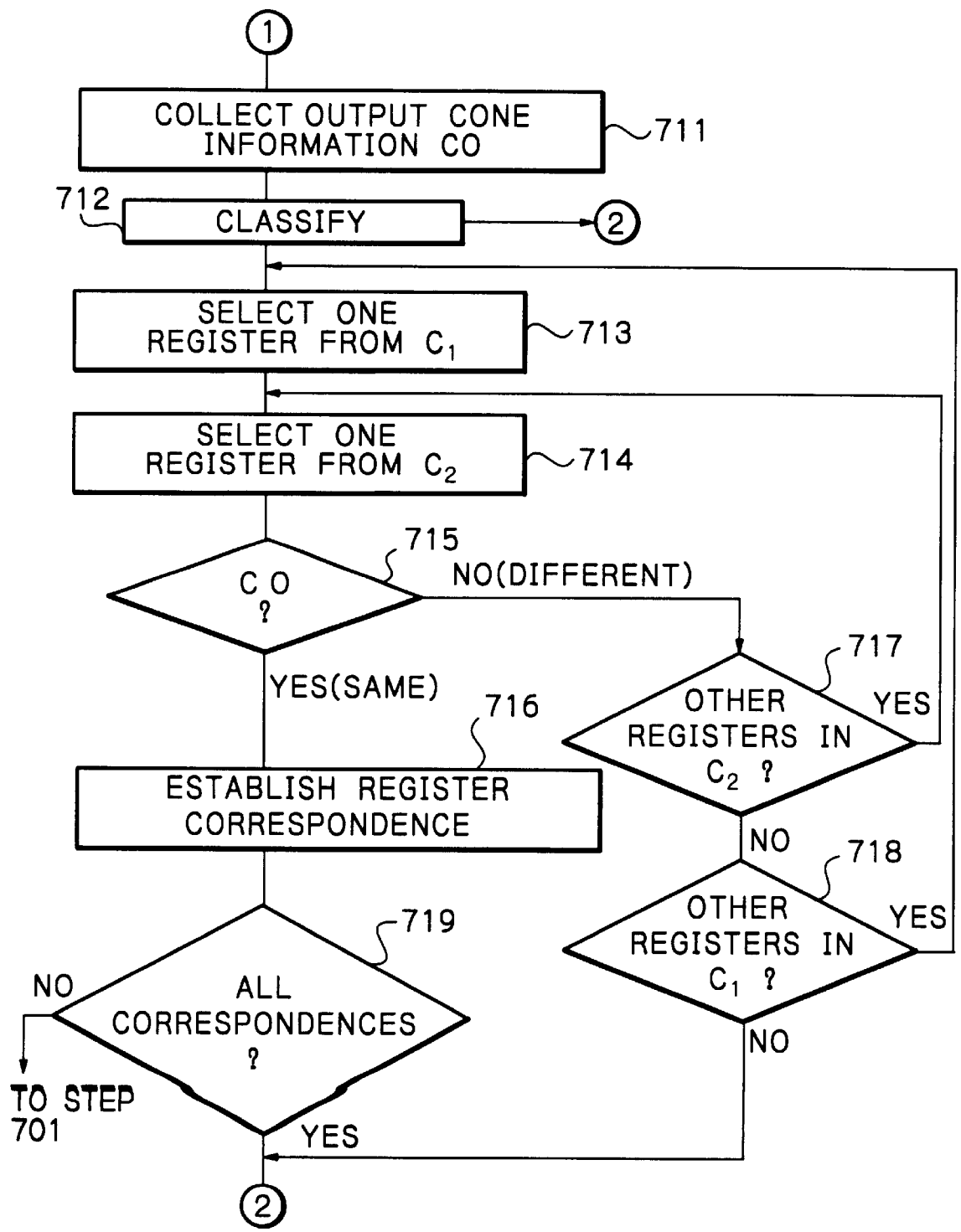
Figure 18C:
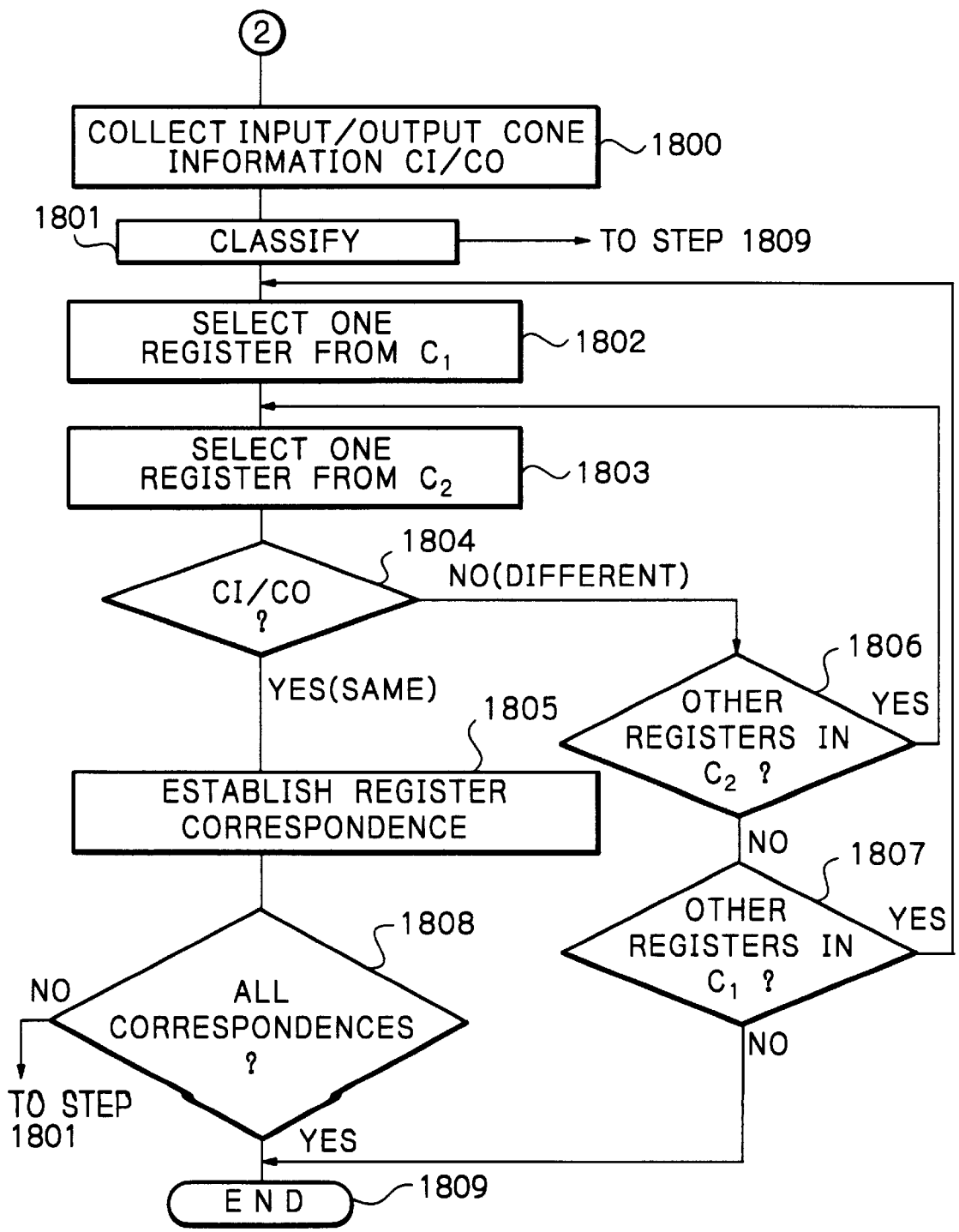

In FIGS. 18A, 18B and 18C, which are flowcharts of modifications of the flowcharts of FIGS. 7A and 7B, steps 710 and 720 of FIGS. 7A and 7B are deleted, and steps 1800 through 1809 are added. In this case, at step 709 or 719, it may be determined that one register of the circuit information $C_1$ corresponds to a plurality of registers of the circuit information $C_2$ or vice versa. In order to surely make a register correspondence between one of the registers of the circuit information $C_1$ and one of the registers of the circuit information $C_2$, the operation at steps 1800 through 1808 are carried out. In this case, all the registers are initially undetermined.

At step 1800, input cone information for each register is collected. Input output cone information CI/CO for one undetermined register R is generally represented by

```
CICO = {(external input terminals),
        (determined registers of an input cone),
        (undetermined registers of the input cone),
        (external output terminals),
        (determined registers of an output cone),
        (undetermined registers of the output cone),
        (presence or absence of a self-feedback
        loop) }
```

Note that "1" designates the presence of a self-feedback loop, and "0" designates the absence of a self-feedback loop.

For example, input/output cone information CI/CO for the register 801 is represented by
CI/CO(801)={(804, 805), (806), (807), (808, 809), (810), (811), 1}

Next, at step 1801, the registers of the circuit information $C_1$ and $C_2$ are again classified into groups I and II as shown in FIG. 9. In this case, it is possible to make a register correspondence between the registers between the group I.

Next, at step 1802, one register which is not determined is selected from the circuit information $C_1$ (the group I). Also, at step 1803, one register which is not determined is selected from the circuit information $C_2$ (the group I).

Figure 19B:
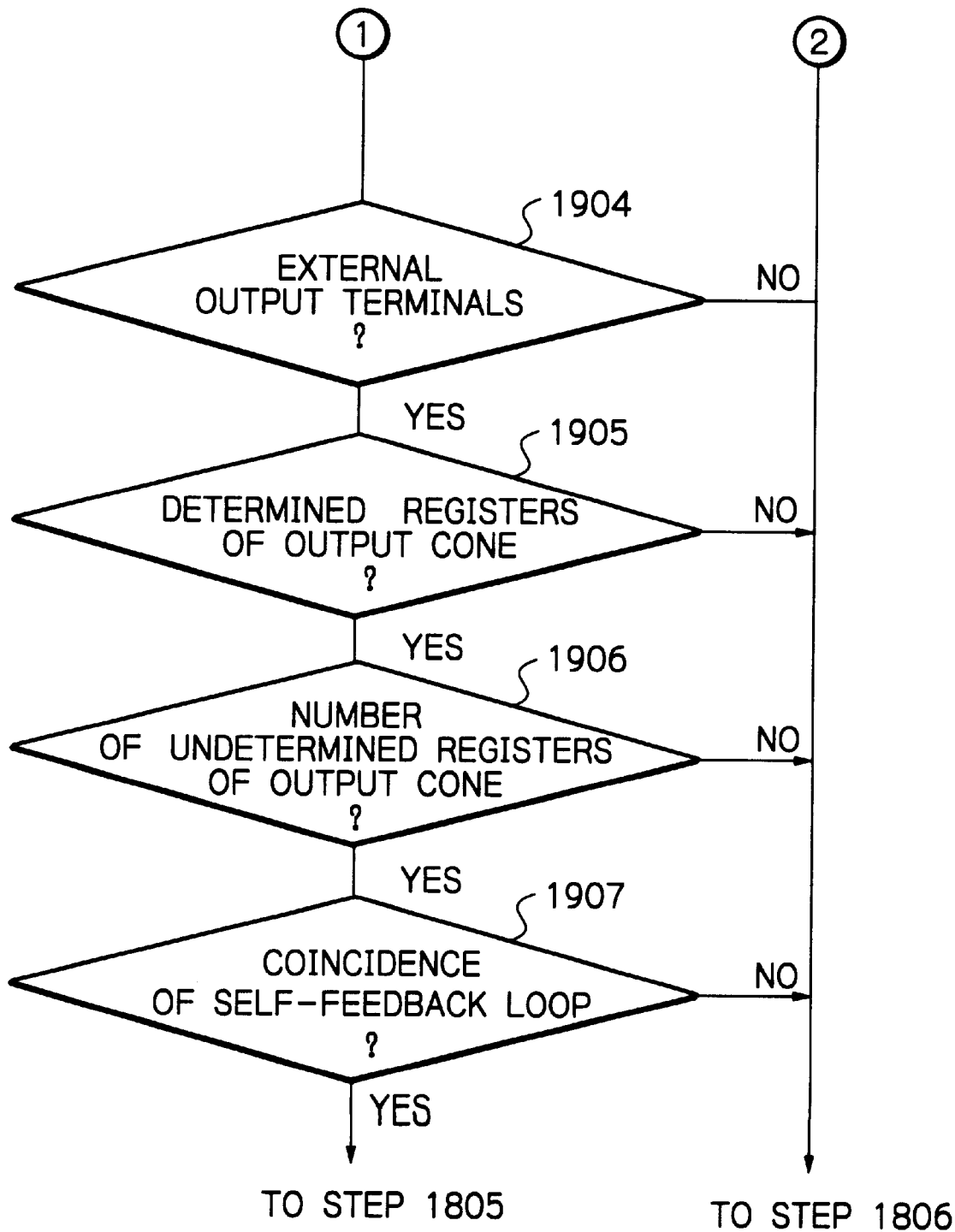

At step 1804, it is determined whether or not the input/output cone information CI/CO of the selected register of the circuit information $C_1$ is the same as the input/output cone information CI/CO of the selected register of the circuit information $C_2$. Step 1804 is illustrated in detail in FIGS. 19A and 19B. That is, at step 1901, it is determined whether or not the external input terminals of the selected register of the circuit information $C_1$ are the same as those of the selected register of the circuit information $C_2$. At step 1902, it is determined whether or not the determined registers of the input cone of the selected register of the circuit information $C_1$ are the same as those of the input cone of the selected register of the circuit information $C_2$. At step 1903, it is determined whether or not the number of the undetermined registers of the input cone of the selected register of the circuit information $C_1$ are the same as that of undetermined registers of the input cone of the selected register of the circuit information $C_2$. At step 1904, it is determined whether or not the external output terminals of the selected register of the circuit information $C_1$ are the same as those of the selected register of the circuit information $C_2$. At step 1905, it is determined whether or not the determined registers of the output cone of the selected register of the circuit information $C_1$ are the same as those of the output cone of the selected register of the circuit information $C_2$. At step 1906, it is determined whether or not the number of the undetermined registers of the output cone of the selected register of the circuit information $C_1$ are the same as that of undetermined registers of the output cone of the selected register of the circuit information $C_2$. At step 1907, it is determined whether or not the presence or absence of a self-feedback loop of the selected register of the circuit information $C_1$ coincides with the presence or absence of a self-feedback loop of the selected register of the circuit information $C_2$. As a result, if all the determinations at steps 1901 through 1907 are affirmative, the control proceeds to step 1805. Contrary to this, if at least one of the determinations at steps 1901 through 1907 is negative, the control proceeds to step 1806.

At step 1805, a correspondence between the selected register of the circuit information $C_1$ and the selected register of the circuit information $C_2$ is established. In other words, the two selected registers are determined.

Step 1806 repeats the operation at steps 1806 and 1804 for other non-selected registers of the circuit information $C_2$. Also, step 1807 repeats the operation at steps 1802 through 1806 for other non-selected registers of the circuit information $C_1$.

At step 1808, it is determined whether or not all the registers of the circuit information $C_1$ and $C_2$ are determined. As a result, if all the registers are determined, the control proceeds to step 1809, thus completing this routine. Otherwise, the control returns to step 1801.

As explained hereinabove, according to the present invention, even if circuit information includes a feedback loop and a test circuit, it is possible to determine a register correspondence, thus effectively enabling logic equivalence verification.

What is claimed is:

1. A register correspondence method in a logic equivalence verifying system for first and second sequential circuit information, comprising the steps of:

collecting input cone information for each register of said first and second sequential circuit information, said input cone information being represented by external input terminals, determined registers, a number of undetermined registers and self-feedback information showing presence or absence of a self-feedback loop;

selecting a first register having unique input cone information from said first sequential circuit information;

selecting a second register having unique input cone information from said second sequential circuit information;

said unique cone information for said first and second registers defined as input cone information which is not identical to the input cone information of each of the other registers in said first and second sequential circuit information respectively;

comparing the input cone information of said first register with that of said second register, thus establishing a register correspondence between said first and second registers, when the input cone information of said first register is equal to that of said second register, each of said determined registers being one where said register correspondence has been established, each of said undetermined registers being one where said register correspondence has not been established.

2. The register correspondence method as set forth in claim 1, further comprising the steps of:

collecting output cone information for each register of said first and second sequential circuit information, said output cone information being represented by external output terminals, determined registers, a number of undetermined registers and self-feedback information showing presence or absence of a self-feedback loop;

selecting a third register having unique output cone information from said first sequential circuit information;

selecting a fourth register having unique output cone information from said second sequential circuit information;

said unique cone information for said third and fourth registers defined as output cone information which is not identical to the output cone information of each of the other registers in said third and fourth sequential circuit information respectively;

comparing the output cone information of said third register with that of said fourth register, thus establishing a register correspondence between said third and fourth registers, when the output cone information of said third register is equal to that of said fourth register.

3. The method as set forth in claim 1, further comprising a step of propagating constant signals to circuit elements of said first and second sequential circuit information and cutting connections to input terminals of said circuit elements, before said input cone information is collected.

4. A register correspondence method in a logic equivalence verifying system for first and second sequential circuit information, comprising the steps of:

collecting input cone information for each register of said first and second sequential circuit information, said input cone information being represented by external input terminals, determined registers, a number of undetermined registers and self-feedback information showing presence or absence of a self-feedback loop;

selecting a first register having unique input cone information from said first sequential circuit information;

selecting a second register having unique input cone information from said second sequential circuit information;

said unique cone information for said first and second registers defined as input cone information which is not identical to the input cone information of each of the other registers in said first and second sequential circuit information respectively;

comparing the input cone information of said first register with that of said second register, so that a register correspondence between said first and second registers is established, when the input cone information of said first register is equal to that of said second register;

repeating operations at said first register selecting step, said second register selecting step and said input cone information comparing step by moving said correspondence established registers from undetermined registers to determined registers;

collecting output cone information for each register of said first and second sequential circuit information, said output cone information being represented by external output terminals, determined registers, a number of undetermined registers and self-feedback information showing presence or absence of a self-feedback loop, after it is determined that the input cone information of said first register is not equal to that of said second register;

selecting a third register having unique output cone information from said first sequential circuit information;

selecting a fourth register having unique output cone information from said second sequential circuit information;

said unique cone information for said third and fourth registers defined as output cone information which is not identical to the output cone information of each of the other registers in said third and fourth sequential circuit information respectively;

comparing the output cone information of said third register with that of said fourth register, so that a register correspondence between said third and fourth registers is established, when the output cone information of said third register is equal to that of said fourth register; and repeating operations at said third register selecting step, said fourth register selecting step and said output cone information comparing step by moving said correspondence established registers from undetermined registers to determined registers.

5. The method as set forth in claim 4, further comprising a step of propagating constant signals to circuit elements of said first and second sequential circuit information and cutting connections to input terminals of said circuit elements, before said input cone information is collected.

6. A register correspondence method in a logic equivalence verifying system for first and second sequential circuit information, comprising the steps of:

collecting input cone information for each register of said first and second sequential circuit information, said input cone information being represented by external input terminals, determined registers, a number of undetermined registers and self-feedback information showing presence or absence of a self-feedback loop;

selecting a first register having unique input cone information from said first sequential circuit information;

selecting a second register having unique input cone information from said second sequential circuit information;

said unique cone information for said first and second registers defined as input cone information which is not identical to the input cone information of each of the other registers in said first and second sequential circuit information respectively;

comparing the input cone information of said first register with that of said second register, so that a register correspondence between said first and second registers is established, when the input cone information of said first register is equal to that of said second register;

repeating operations at said first register selecting step, said second register selecting step and said input cone information comparing step by moving said correspondence established registers from undetermined registers to determined registers;

collecting output cone information for each register of said first and second sequential circuit information, said output cone information being represented by external output terminals, determined registers, a number of undetermined registers and self-feedback information showing presence or absence of a self-feedback loop, after it is determined that the input cone information of said first register is not equal to that of said second register;

selecting a third register having unique output cone information from said first sequential circuit information;

selecting a fourth register having unique output cone information from said second sequential circuit information;

said unique cone information for said third and fourth registers defined as output cone information which is not identical to the output cone information of each of the other registers in said third and fourth sequential circuit information respectively;

comparing the output cone information of said third register with that of said fourth register, so that a register correspondence between said third and fourth registers is established, when the output cone information of said third register is equal to that of said fourth register;

repeating operations at said third register selecting step, said fourth register selecting step and said output cone information comparing step by moving said correspondence established registers from undetermined registers to determined registers;

collecting input/output cone information for each register of said first and second sequential circuit information, said input/output cone information being represented by external input terminals, external output terminals, determined registers, a number of undetermined registers and self-feedback information showing presence or absence of a self-feedback loop, after it is determined that all registers of said first sequential circuit information correspond to all registers of said second sequential circuit information;

selecting a fifth register having unique input/output cone information from said first sequential circuit information;

selecting a sixth register having unique input/output cone information from said second sequential circuit information;

said unique cone information for said fifth and sixth registers defined as input/output cone information which is not identical to the input/output cone information of each of the other registers in said fifth and sixth sequential circuit information respectively;

comparing the input/output cone information of said fifth register with that of said sixth register, so that a register correspondence between said fifth and sixth registers is established, when the output cone information of said fifth register is equal to that of said sixth register; and repeating operations at said fifth register selecting step, said sixth register selecting step and said input/output cone information comparing step by moving said correspondence established registers from undetermined registers to determined registers.

7. A register correspondence apparatus in a logic equivalence verifying system for first and second sequential circuit information, comprising:

means for collecting input cone information for each register of said first and second sequential circuit information, said input cone information being represented by external input terminals, determined registers, a number of undetermined registers and self-feedback information showing presence or absence of a self-feedback loop;

means for selecting a first register having unique input cone information from said first sequential circuit information;

means for selecting a second register having unique input cone information from said second sequential circuit information;

said unique cone information for said first and second registers defined as input cone information which is not identical to the input cone information of each of the other registers in said first and second sequential circuit information respectively;

means for comparing the input cone information of said first register with that of said second register, thus establishing a register correspondence between said first and second registers, when the input cone information of said first register is equal to that of said second register, each of said determined registers being one where said register correspondence has been established, each of said undetermined registers being one where said register correspondence has not been established.

8. The register correspondence apparatus as set forth in claim 7, further comprising:

means for collecting output cone information for each register of said first and second sequential circuit information, said output cone information being represented by external output terminals, determined registers, a number of undetermined registers and self-feedback information showing presence or absence of a self-feedback loop;

means for selecting a third register having unique output cone information from said first sequential circuit information;

means for selecting a fourth register having unique output cone information from said second sequential circuit information;

said unique cone information for said third and fourth registers defined as output cone information which is not identical to the output cone information of each of the other registers in said third and fourth sequential circuit information respectively;

means for comparing the output cone information of said third register with that of said fourth register, thus establishing a register correspondence between said third and fourth registers, when the output cone information of said first register is equal to that of said second register.

9. The apparatus as set forth in claim 7, further comprising means for propagating constant signals to circuit elements of said first and second sequential circuit information and cutting connections to input terminals of said circuit elements, before said input cone information is collected.

10. A register correspondence apparatus in a logic equivalence verifying system for first and second sequential circuit information, comprising:

means for collecting input cone information for each register of said first and second sequential circuit information, said input cone information being represented by external input terminals, determined registers, a number of undetermined registers and self-feedback information showing presence or absence of a self-feedback loop;

means for selecting a first register having unique input cone information from said first sequential circuit information;

means for selecting a second register having unique input cone information from said second sequential circuit information;

said unique cone information for said first and second registers defined as input cone information which is not identical to the input cone information of each of the other registers in said first and second sequential circuit information respectively;

means for comparing the input cone information of said first register with that of said second register, so that a register correspondence between said first and second registers is established, when the input cone information of said first register is equal to that of said second register;

means for repeating operations at said first register selecting step, said second register selecting step and said input cone information comparing step by moving said correspondence established registers from undetermined registers to determined registers;

means for collecting output cone information for each register of said first and second sequential circuit information, said output cone information being represented by external output terminals, determined registers, a number of undetermined registers and self-feedback information showing presence or absence of a self-feedback loop, after it is determined that the input cone information of said first register is not equal to that of said second register;

means for selecting a third register having unique output cone information from said first sequential circuit information;

means for selecting a fourth register having unique output cone information from said second sequential circuit information;

said unique cone information for said third and fourth registers defined as output cone information which is not identical to the output cone information of each of the other registers in said third and fourth sequential circuit information respectively;

means for comparing the output cone information of said third register with that of said fourth register, so that a register correspondence between said third and fourth registers is established, when the output cone information of said third register is equal to that of said fourth register; and means for repeating operations at said third register selecting step, said fourth register selecting step and said output cone information comparing step by moving said correspondence established registers from undetermined registers to determined registers.

11. The apparatus as set forth in claim 10, further comprising means for propagating constant signals to circuit elements of said first and second sequential circuit information and cutting connections to input terminals of said circuit elements, before said input cone information is collected.

12. A register correspondence apparatus in a logic equivalence verifying system for first and second sequential circuit information, comprising the steps of:

means for collecting input cone information for each register of said first and second sequential circuit information, said input cone information being represented by external input terminals, determined registers, a number of undetermined registers and self-feedback information showing presence or absence of a self-feedback loop;

means for selecting a first register having unique input cone information from said first sequential circuit information;

means for selecting a second register having unique input cone information from said second sequential circuit information;

said unique cone information for said first and second registers defined as input cone information which is not identical to the input cone information of each of the other registers in said first and second sequential circuit information respectively;

means for comparing the input cone information of said first register with that of said second register, so that a register correspondence between said first and second registers is established, when the input cone information of said first register is equal to that of said second register;

means for repeating operations at said first register selecting means, said second register selecting means and said input cone information comparing means by moving said correspondence established registers from undetermined registers to determined registers;

means for collecting output cone information for each register of said first and second sequential circuit information, said output cone information being represented by external output terminals, determined registers, a number of undetermined registers and self-feedback information showing presence or absence of a self-feedback loop, after it is determined that the input cone information of said first register is not equal to that of said second register;

means for selecting a third register having unique output cone information from said first sequential circuit information;

means for selecting a fourth register having unique output cone information from said second sequential circuit information;

said unique cone information for said third and fourth registers defined as output cone information which is not identical to the output cone information of each of the other registers in said third and fourth sequential circuit information respectively;

means for comparing the output cone information of said third register with that of said fourth register, so that a register correspondence between said third and fourth registers is established, when the output cone information of said third register is equal to that of said fourth register;

means for repeating operations at said third register selecting means, said fourth register selecting means and said output cone information comparing means by moving said correspondence established registers from undetermined registers to determined registers;

means for collecting input/output cone information for each register of said first and second sequential circuit information, said input/output cone information being represented by external input terminals, external output terminals, determined registers, a number of undetermined registers and self-feedback information showing presence or absence of a self-feedback loop, after it is determined that all registers of said first sequential circuit information correspond to all registers of said second sequential circuit information;

means for selecting a fifth register having unique input/output cone information from said first sequential circuit information;

means for selecting a sixth register having unique input/output cone information from said second sequential circuit information;

said unique cone information for said fifth and sixth registers defined as input/output cone information which is not identical to the input/output cone information of each of the other registers in said fifth and sixth sequential circuit information respectively;

means for comparing the input/output cone information of said fifth register with that of said sixth register, so that a register correspondence between said fifth and sixth registers is established, when the output cone information of said fifth register is equal to that of said sixth register; and means for repeating operations at said fifth register selecting means, said sixth register selecting means and said input/output cone information comparing means by moving said correspondence established registers from undetermined registers to determined registers.

* * * * *